US 7,256,378 B2

(12) United States Patent
Furukawa et al.

(10) Patent No.: US 7,256,378 B2
(45) Date of Patent: Aug. 14, 2007

(54) OUTPUT-COMPENSATING DEVICE FOR IMAGE SENSOR

(75) Inventors: Makoto Furukawa, Saitama (JP); Sukeyuki Shinotsuka, Saitama (JP); Jiro Kurita, Saitama (JP); Katsuhiko Takebe, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 331 days.

(21) Appl. No.: 10/452,390

(22) Filed: May 30, 2003

(65) Prior Publication Data

US 2004/0069929 A1    Apr. 15, 2004

Related U.S. Application Data

(63) Continuation of application No. PCT/JP01/09819, filed on Nov. 9, 2001.

(30) Foreign Application Priority Data

| Dec. 1, 2000 | (JP) | 2000-403768 |
| Dec. 28, 2000 | (JP) | 2000-404931 |
| Dec. 28, 2000 | (JP) | 2000-404933 |
| Feb. 8, 2001 | (JP) | 2001-75034 |
| Feb. 8, 2001 | (JP) | 2001-075035 |
| Feb. 8, 2001 | (JP) | 2001-075036 |
| Mar. 9, 2001 | (JP) | 2001-116116 |
| Nov. 9, 2001 | (WO) | PCT/JP01/09819 |
| Jun. 6, 2002 | (WO) | 02/45414 |

(51) Int. Cl.
 *H01L 27/00* (2006.01)

(52) U.S. Cl. ............. 250/208.1; 250/238; 250/214 C; 348/302; 348/229.1

(58) Field of Classification Search ............. 250/208.1, 250/214 C, 214 AG, 238; 348/229.1, 302
See application file for complete search history.

(56) References Cited

U.S. PATENT DOCUMENTS 6,191,408 B1 *  2/2001  Shinotsuka et al. ...... 250/208.1
6,828,539 B1 * 12/2004  Kuwabara ................ 250/208.1

FOREIGN PATENT DOCUMENTS

JP    2000-175108    6/2000
JP    2000-329616   11/2000

* cited by examiner

*Primary Examiner*—Stephone B. Allen
*Assistant Examiner*—Patrick J. Lee
(74) *Attorney, Agent, or Firm*—Fulbright & Jaworski L.L.P.

(57) ABSTRACT

An output compensating device capable of optimally compensating output signals of an image sensor composed of a number of light-sensor circuits, each of which represents a unit pixel and is capable of producing in a photoelectric converting element a sensor current proportional to a quantity of light falling thereon, converting the current into a voltage signal by a MOS type transistor with a logarithmic output characteristic in a weak inverse state, initializing itself by removing a charge accumulated in a parasitic capacitor of the photoelectric converting element by changing a drain voltage of the transistor to a value lower than a normal value for a specified time and outputting a pixel signal having a logarithmic characteristic at a large quantity of the sensor current and a pixel signal having a non-logarithmic characteristic at a small quantity of the sensor current. This device has a means for compensating each pixel signal from the image sensor for an offset value and outputting a resulting signal if said signal has an output characteristic within a logarithmic response region or a non-logarithmic region depending on the output condition and, if not, further compensating the offset-compensated signal for its gain and outputting a resulting signal, thus ensuring the optimal compensation of each pixel signal of the image sensor in accordance with its output state.

8 Claims, 38 Drawing Sheets

OUTPUT-COMPENSATING DEVICE FOR IMAGE SENSOR

This application is a continuation of international application PCT/JP01/09819, filed on Nov. 9, 2001, which designated the United States and in now abandoned.

BACKGROUND OF THE INVENTION

The present invention relates to an output compensating device for an image sensor and, more specifically, to an output compensating device for compensating for variations in pixel outputs of a MOS type image sensor.

Japanese Laid-Open Patent Publication No. 2000-329616 discloses a conventional MOS transistor type image sensor, in which a light sensor circuit used as a unit pixel comprises, as shown in FIG. 1, a photo-diode PD operating as a photoelectric converting element for producing a sensor current proportional to the quantity of incident light Ls falling thereon, a transistor Q1 having a logarithmic output characteristic in a weak inverse state for converting the sensor current produced in the photodiode into a voltage signal Vpd, a transistor Q2 for amplifying the voltage signal Vpd and a transistor Q3 for outputting a sensor signal in accordance with a timing pulse of a readout signal Vs and which circuit is characterized by its a wide dynamic range obtained by giving the output a logarithmic characteristic, thereby achieving the high sensitivity of detecting a light signal. In addition, the light sensor circuit is provided with a means for changing a drain voltage VD of the transistor Q1 to a value lower than a normal value for a specified period to remove a charge accumulated in a parasitic capacitor C of the photodiode PD to initialize the circuit. The light sensor circuit can thus obtain a voltage signal Vpd corresponding to the quantity of incident light Ls even if the sensor current absurdly changed, thereby eliminating the possibility of occurrence of afterglow of each pixel even at a small quantity of incident light.

As shown in FIG. 3, the above-described light sensor circuit may output a signal with a logarithmic characteristic at a normal quantity of sensor current corresponding to a normal quantity of incident light to a photodiode but it may not maintain the logarithmic output characteristic and may have a substantially linear output characteristic at a decreased sensor current due to a delay of charging the parasite capacitor of the photodiode. In FIG. 3, WA represents a region of responding with a non-logarithmic characteristic output and WB represents a region of responding with a logarithmic characteristic output.

However, the conventional image sensor using the light sensor circuits, in which a sensor current proportional to incident light is produced in a photo-electric converting element and converted into a voltage signal by using a MOS type transistor having logarithmic output characteristic in a weak inverse state, still involves such a problem that it cannot be free from the occurrence of unwanted afterglow of each pixel with a decreased quantity of incident illumination falling on the photoelectric converting element.

The MOS type image sensor may suffer variations in output characteristics of pixel signals, which may be resulted from structure-derived variations in output characteristics and variations in temperature characteristics of respective light sensor circuits.

Japanese Laid-Open Patent Publication No. 2000-175108 discloses a conventional image sensor using the light sensor circuits as respective pixels, in which a sensor current proportional to incident light is produced in a photo-electric converting element and converted into a voltage signal by using a MOS type transistor having logarithmic output characteristic in a weak inverse state, wherein variations in its output with a change in temperature (as shown in FIG. 37) are compensated for according to the image sensor temperature detected by a temperature sensor.

FIG. 41 shows a construction of a conventional image sensor, in which a sensor signal AlSig from the image sensor 7 is compensated for temperature variations by doing digital operations according to a temperature signal Atemp detected by a temperature sensor 12.

In the image sensor of FIG. 41, each of sensor signals AlSig output from the image sensor 7 is converted by an A-D converter IADC into a digital signal DlSig that is then transferred to a digital temperature compensation circuit DCAL. A temperature signal Atemp from a temperature sensor 12 provided in the image sensor 7 is also converted by an A-D converter TADC into a digital signal Dtemp that is then transferred to a lookup table LUT of characteristic offset compensation values preset versus variable temperatures. An offset compensation value DtempOFS corresponding to the currently detected temperature of the image sensor 7 is selected from the lookup table LUT and given to the digital temperature compensation circuit DCAL by which the digital sensor signal DlSig is corrected by adding to or subtracting from the signal the given offset compensation value DtempOFS. The compensated digital sensor signal can thus be obtained. When compensating sensor signals from the image sensor are processed by the digital compensation circuit, each of pixel sensor signals and a temperature detection signal from the temperature sensor are necessarily converted by A-D converters into digital signals. However, if sensor signals might vary in a wide range as the temperature changes, the A-D converter for converting the sensor signals must be set to a wide input range. This limits the use of the A-D converter. Furthermore, the temperature compensation of sensor signals by calculations may require the provision of a complicated compensating configuration.

SUMMARY OF THE INVENTION

The present invention is directed to an output compensating device for an image sensor composed of a number of light sensor circuits, each of which represents a unit pixel and uses a photoelectric converting element for detecting a light signal and converting the same signal into an electric signal and a MOS type transistor having a gate voltage fixed to a level for providing an overflow drain for charging and discharging a parasitic capacitor of the photoelectric converting element and converting a sensor current signal of the photoelectric converting element into a voltage signal having a logarithmic characteristic in a weakly inverted state. This image sensor is further provided with means for changing drain voltages of the transistors for respective pixels from a normal to a lower level for a specified period to remove charges accumulated in parasitic capacitors of respective photoelectric converting elements to initialize all pixels before detecting light signals from them. In this image sensor, even if the sensor current rapidly decreased with a decreased illumination, each sensor circuit may immediately obtain a voltage signal corresponding to the incident light quantity at that moment, thereby eliminating the possibility of occurrence of afterglow of the pixel at a decreased quantity of incident light. An object of the present invention is to provide an output compensating device for the above-described image sensor, which is capable of optimally compensating for variations of output characteristics of respective pixel signals composing an output image of the sensor by conducting the offset compensation for variations in output levels and gain compensation for variations in sensitivity respectively in accordance with conditions of the image signal. In practice, the output compensating device conducts the offset compensation of each pixel signal and outputs the offset compensated signal if it has a characteristic within the logarithmic or non-logarithmic response region depending upon the state of output variation or conducts further the gate compensation if it has a characteristic within the non-logarithmic or logarithmic response region.

Specifically, according to the present invention, each pixel output signal is suitably compensated for variations in output and temperature characteristics by first conducting the offset compensation for temperature characteristic variation, second the offset compensation for the output characteristic variation and finally the gain compensation for temperature characteristic variation.

Another object of the present invention is to provide an output compensating device for the above-described image sensor, which is capable of suitably compensating for variations in output characteristic and temperature characteristic of each pixel signal of the image sensor by conducting first the offset compensation for output characteristic variation, second the offset and gain compensation for temperature characteristic variation and finally the gain compensation for output characteristic variation.

Another object of the present invention is to provide an output compensating device for the above-described image sensor, which is capable of accurately compensating for the temperature characteristic variations of each sensor signal of the image sensor by digital processing operations by effectively using an A-D converter with a narrow input range in such a manner that an output signal from each light sensor composing the image sensor is compensated first for temperature characteristic variation by carrying out analog processing method and the analog compensated signal with a least variation is then converted by an A-D converter into a digital signal that is then compensated by digital processing method for variation in a non-linear portion of temperature characteristic which variation could not be eliminated by the analog compensating method.

Another object of the present invention is to provide an output compensating device for the above-described image sensor, which forms an integral part of the image sensor which is a single compact device comprising a sensor body for reading outputs of light sensor circuits forming a matrix of pixels and a peripheral circuit for compensating for variations in output of respective pixel circuits. Namely, the image sensor body, a memory for storing output compensation values for respective pixels and an arithmetic operational circuit for performing calculations for output compensation are mounted all on a single chip or circuit substrate to form a compact single unit.

Another object of the present invention is to provide an output compensating device for the above-described image sensor, which comprises a memory and an operational processing circuit mounted in a single compact package in which a chip with an image body for reading output signals from a matrix of pixels is mounted.

Another object of the present invention is to provide an output compensating device for the above-described image sensor, which is capable of compensating for temperature-output variations of each of sensor signals from the image sensor, not doing calculating operation by any compensational calculation circuit, in such a manner that a bias voltage through a reference resistance is applied to an output side of each of MOS type light sensor circuits and is adjusted by a adjusting means in accordance with a detection signal from a temperature sensor of the image sensor to realize the offset compensation for temperature characteristic variation of the output pixel signal.

PREFERRED EMBODIMENTS OF THE PRESENT INVENTION

Figure 1:
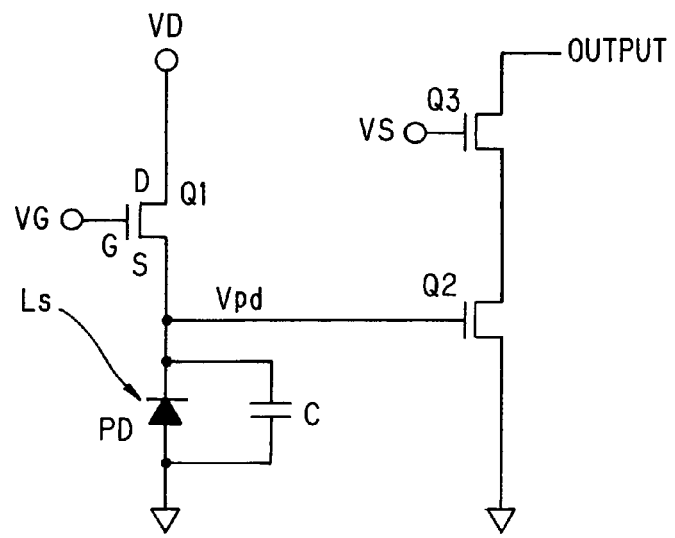
FIG. 1 is an electric circuit diagram of a light sensor circuit for one pixel, which is used as a unit component of an image sensor according to the present invention.

In an image sensor, to which with an output compensating device of the present invention is applied, a light sensor circuit illustrated in FIG. 1 is used as a unit pixel.

The light sensor circuit can produce a sensor current in the transistor Q1 while a sufficient quantity of light Ls is falling on the photodiode PD and can therefore detect a light signal at a response speed sufficient not to produce an afterimage of the pixel owing to a relatively small value of resistance of the transistor Q1. However, since the transistor Q1 is set to operate with resistance increased by one order when a current therein decreases by one order, decreasing the current flowing in the transistor Q1 with a decrease in the quantity of incident light Ls falling to the photodiode PD causes the transistor Q1 to rapidly increase its resistance. At the same time, a time constant of the circuit containing a parasitic capacitor C of the photodiode PD with the increased resistance is increased to elongate the time necessary for removing the electric charge accumulated in the parasitic capacitor C. As a result, an afterimage can be viewed for a longer duration as the quantity of incident light Ls decreases.

Figure 34:
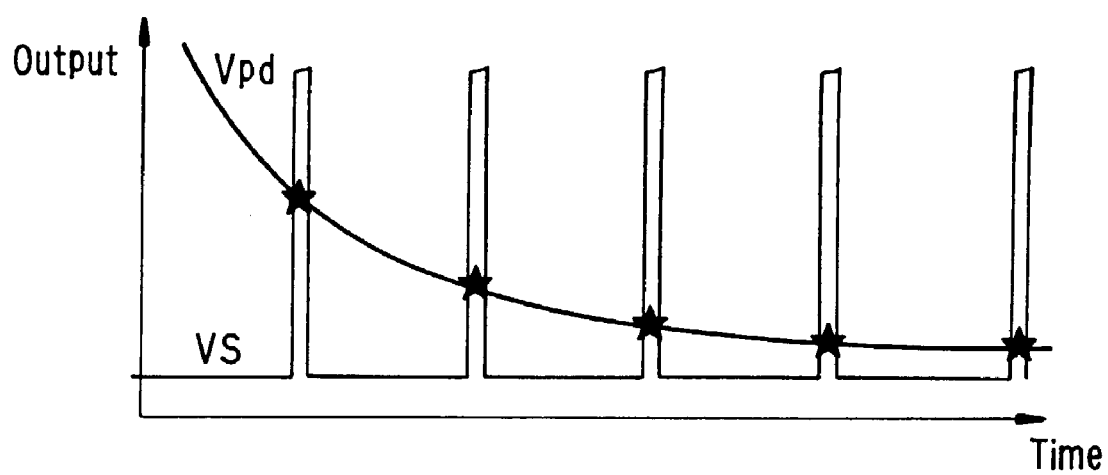
FIG. 34 shows an output characteristic of a pixel signal read in accordance with a specified timing pulse at the decreased quantity of incident light falling on a pixel light sensor circuit without initialization of the image sensor.

The saturation time of a voltage signal Vpd corresponding to a sensor current in the photodiode PD with a decreased quantity of incident light thereto also increases. Therefore, if a pixel signal Vo is output in accordance with timing pulses of a reading signal Vs as shown in FIG. 34, then an output appears with an afterglow that may be of a higher level at an earlier time. In FIG. 34, Vpd' designates an inverse amplified voltage signal produced by the amplifying transistor Q2.

According to the present invention, the light sensor circuit is capable of initializing itself before detecting a pixel signal Vo by removing the electric charge accumulated in a parasitic capacitor C of the photodiode PD by changing a drain voltage VD of the transistor Q1 to a level lower than a normal for a specified period. This enables the light sensor circuit to immediately obtain a voltage signal corresponding to the quantity of incident light Ls at that time even if the sensor current rapidly changes. Thus, the light sensor circuit may not cause an afterglow of the pixel even with a small quantity of incident light Ls.

Figure 2:
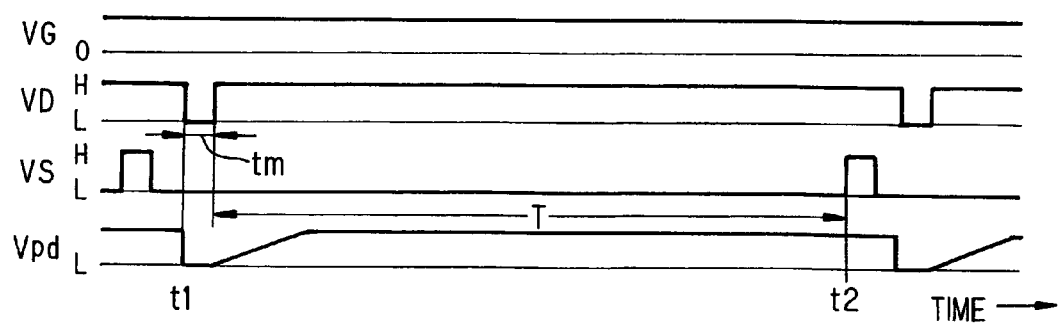
FIG. 2 is a time chart of signals to be generated in the light sensor circuit.
Figure 3:
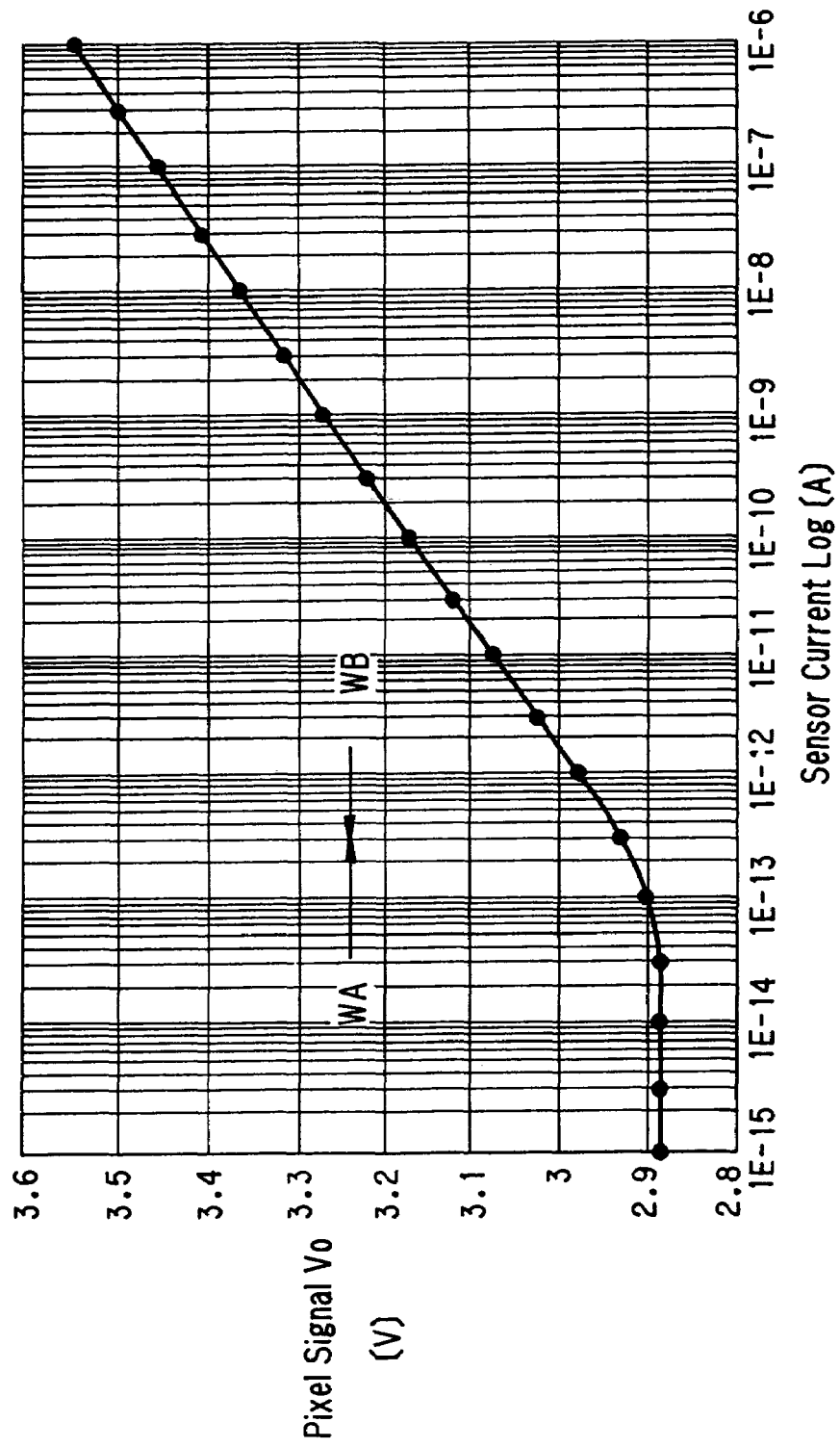
FIG. 3 shows a characteristic of a pixel output signal versus a light sensor current.

FIG. 2 shows a time chart of signals produced at various portions of the light sensor circuit. In FIG. 2, t1 is an initializing timing pulse and t2 is a light-signal detection timing pulse. A specified time tm for which the drain voltage VD of the transistor Q1 is switched from a normal value (high level H) to a lower voltage value (low level L) and kept at the low level L is set for example to about 5 microseconds in case of reading a pixel at a speed of about 100 nanoseconds. In FIG. 2, T designates a period for accumulating a charge in a parasitic capacitor C of the photodiode PD, which period is about 1/30 (or 1/60) seconds for a NTSC signal.

In the light sensor circuit, once the drain voltage VD of the transistor Q1 was switched over to the low level L for initializing the circuit, the transistor Q1 is brought into the low-resistance state if a potential between the gate voltage VG and the drain voltage VD is greater than a threshold of the transistor Q1. Therefore, the source side potential at that moment becomes equal to the drain voltage VD (the source voltage for n-MOS transistor is equal to the drain voltage), causing the junction capacitor C of the photodiode C to be discharged.

Figure 4:
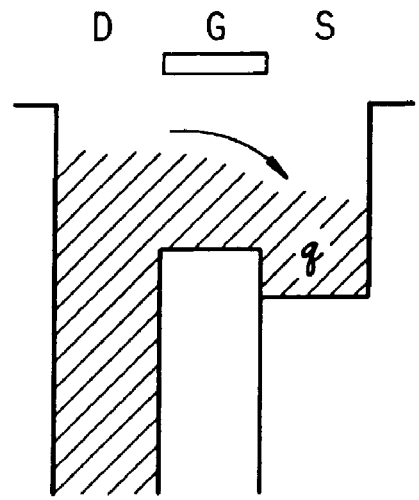
FIG. 4 is a mimic illustration of operation state of a transistor Q1 with a flow of an electric charge (q) therein when initializing a light sensor circuit.

FIG. 4 is a mimic illustration of the operation of the light sensor circuit by a flow of electric charge q of the transistor Q1 when initializing the circuit.

Once the drain voltage VD of the transistor Q1 was changed to the normal value (high level H) with an elapse of the time tm and a light signal was then detected, the source side potential becomes lower than the drain voltage VD. If the difference between the gate voltage VG and the drain voltage VD is larger than the threshold, the MOS type transistor Q1 reaches the low-resistance state and allows the junction capacitor C of the photodiode to be charged again.

Figure 5:
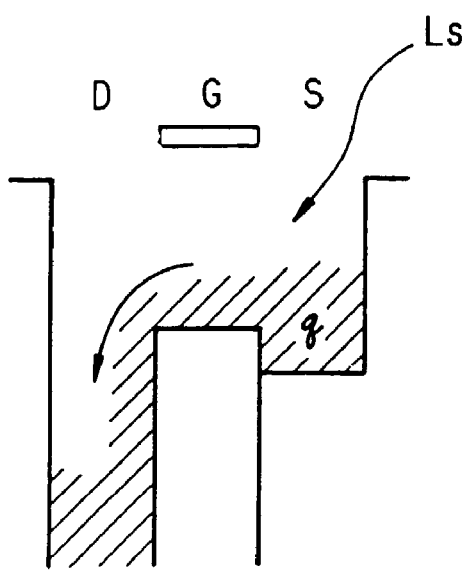
FIG. 5 is a mimic illustration of the operation state of a transistor Q1 with a flow of an electric charge (q) therein when detecting a light signal of the light sensor circuit.

FIG. 5 is a mimic illustration of the operation of the light sensor circuit by a flow of electric charge q of the transistor Q1 when detecting a light signal. The junction capacitor C of the photodiode PD is discharged for initializing the light sensor circuit before detecting a light signal and then charged. In this case, the output voltage Vpd (a terminal voltage of the photodiode PD) with an elapse of a specified time from the initializing timing attains a value corresponding to the quantity of incident light Ls. In other words, the light sensor circuit after initialization can obtain a discharging characteristic with a specified time constant in response to a change in the quantity of incident light Ls.

In that case, if the light sensor circuit is left as it is for a long time, a current supplied from the drain voltage VD through the transistor Q1 becomes equal to a current flowing in the photodiode PD. The same discharging characteristic can be thus always maintained as far as no charge remains. This prevents the occurrence of afterglow of pixels.

The light sensor circuit can therefore obtain a pixel signal Vo corresponding to the quantity of incident light Ls with no afterglow of the pixel by detecting a light signal with an elapse of a specified time after initialization of the circuit.

Figure 6:
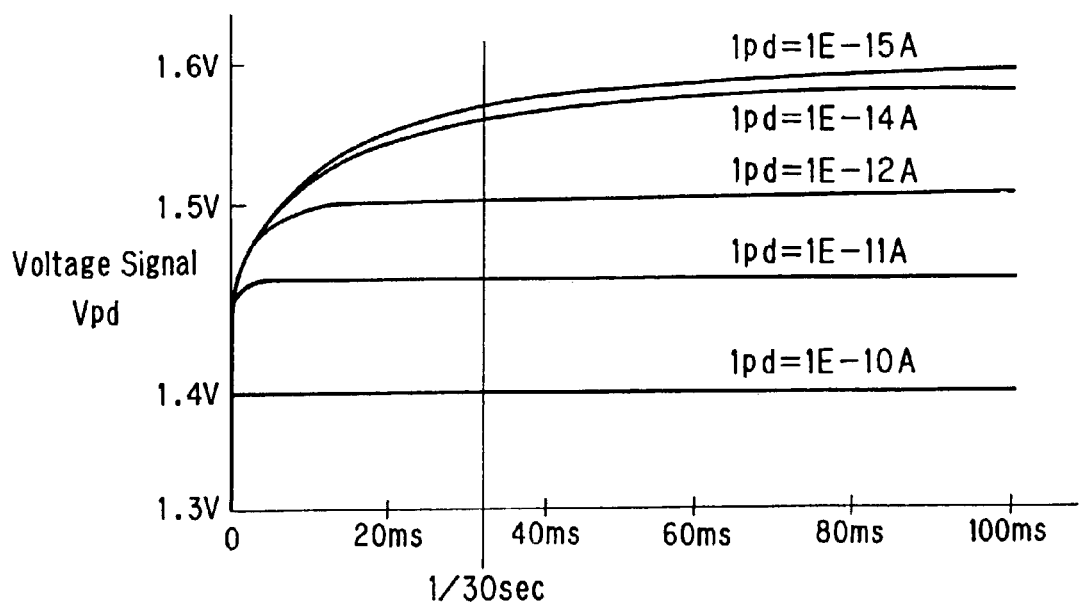
FIG. 6 shows characteristic curves reflecting variations of rising time of a voltage signal Vpd with a change in density of incident light (Ls) falling on a photodiode of the light sensor circuit.

FIG. 6 illustrates a difference in the rising time of a voltage signal Vpd with a change in the quantity of incident light Ls falling on the light sensor circuit.

Figure 7:
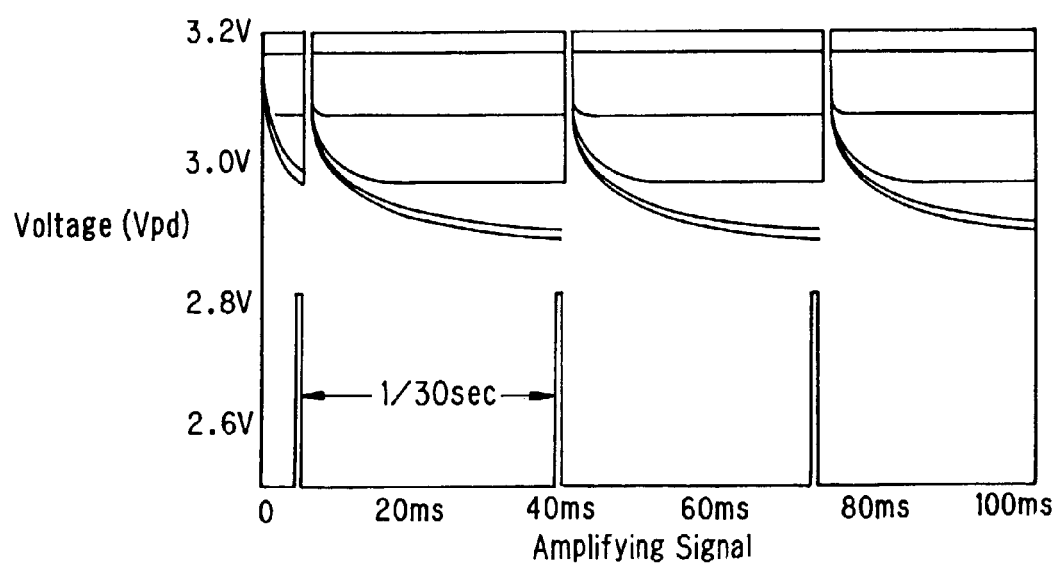
FIG. 7 shows characteristic curves of a voltage Vpd amplifying signal when the light signal reading-out operation is repeated at a specified interval by the light sensor circuit.

FIG. 7 shows characteristics of the amplified voltage signal Vpd when light signals were repeatedly read at an interval of 1/30 sec. The diagram indicates that the signal characteristics obtained every 1/30 seconds correspond to the sensor current proportional to the quantity of incident light Ls falling on the photodiode PD with no effect of afterglow of the pixel.

Figure 8:
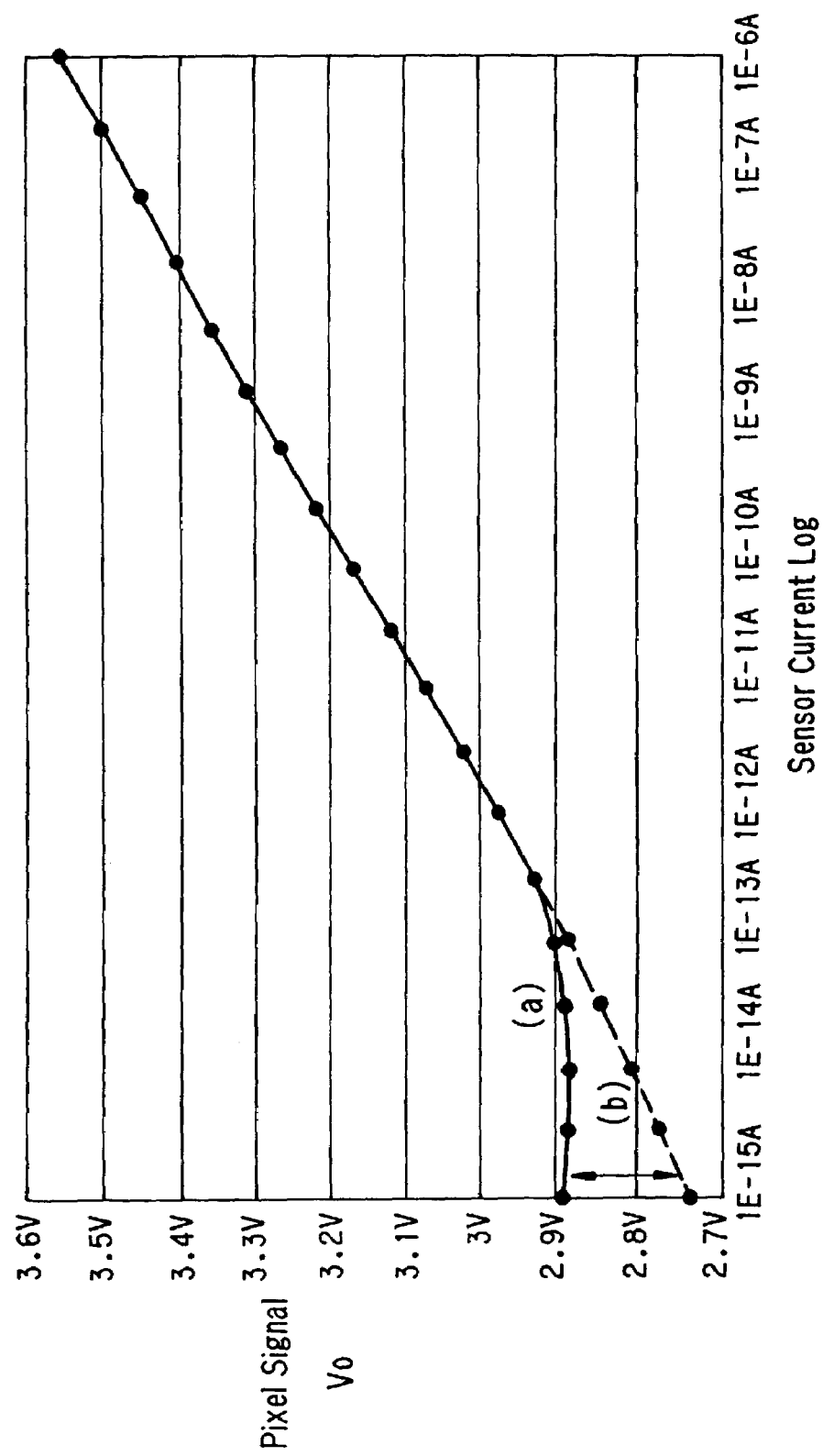
FIG. 8 shows characteristic curves of a voltage signal Vpd changing with a change of a sensor current of a photodiode PD in the light sensor circuit.

FIG. 8 shows output characteristics of a pixel Vo, which were obtained by changing the quantity of incident light Ls falling on the photodiode PD. The diagram indicates that the sensor signal has a complete logarithmic output characteristic at the sensor current of IE-13A or more in the photodiode PD. It is also found that the output signal is not logarithmic at the sensor current of less than IE-13A but does not cause afterglow.

The diagram also indicates that the output characteristic shown in the line segment (a) of FIG. 8 can be obtained by adjusting the threshold of the low level L to which the drain voltage VD of the transistor Q1 must be changed over and by decreasing the drain voltage until the transistor Q1 reaches the state of completely low resistance. On the contrary, the normal logarithmic output characteristic shown in the line segment (b) of FIG. 8 can be obtained by setting the control voltage VD to the same value that the gate voltage VG has.

Therefore, the output characteristic of (a) in FIG. 8 is free from the effect of pixel afterglow but the light signal detecting sensitivity is decreased with a small quantity of incident light while the output characteristic of (b) in FIG. 8 may obtain a high detection sensitivity at a small quantity of incident light but may have a remarkable afterglow. In other words, there is a trade-off relation between the detection sensitivity and afterglow.

Therefore, it is desirable to adjust the drain voltage VD of the transistor to obtain the output characteristic in an intermediate region between the output characteristic shown in (a) of FIG. 8 and the logarithmic output characteristic shown in (b) of FIG. 8 on the following condition:

For the applications where the afterglow is acceptable, the drain voltage of the transistor must be set to a value at which the higher detection sensitivity is obtained. On the contrary, for the applications where the afterglow must be avoided, the drain voltage must be set to a value at which no afterglow may be produced. In practice, the drain voltage VD is adjusted to a value selected for obtaining the highest detection sensitivity in view of the actual application and the actually permissible afterglow.

The present invention is applied to an image sensor consisting of a number of the above-described light sensor circuits arranged to form a matrix of pixels (i.e., light sensor circuits), wherein sensor signals from respective pixels are read by scanning in a time series and the pixels can be initialized in time adapted to the readout-scanning of respective sensor signals.

Figure 9:
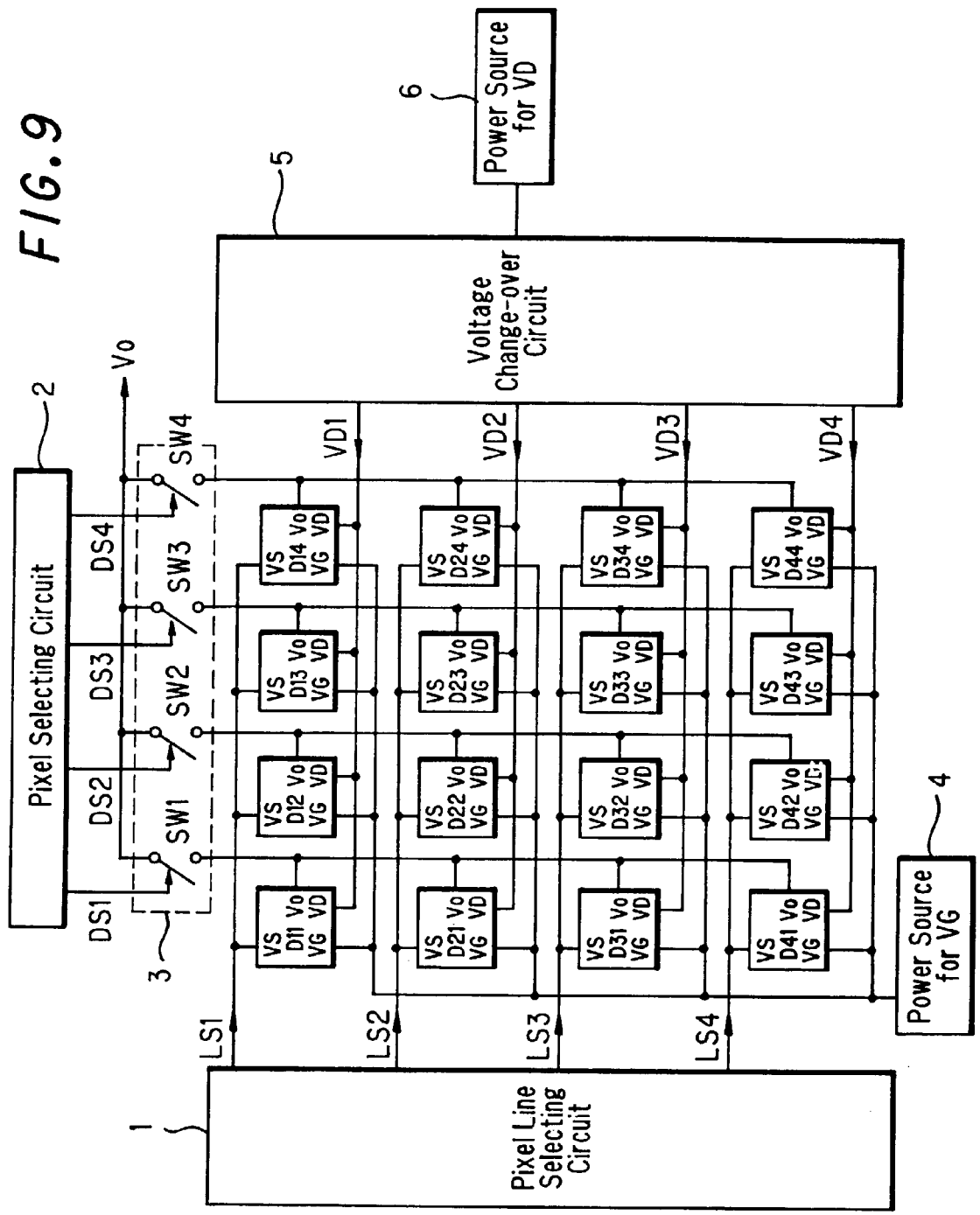
FIG. 9 is a basic block diagram of an image sensor to which an embodiment of the present invention applied.

FIG. 9 shows an exemplary construction of an image sensor realizing the above conditions.

The image sensor is composed of 4×4 pixels D11~D44 arranged in a matrix of pixel circuits, in which pixel lines are selected one by one with respective selecting signals LS1~LS4 successively output from a pixel line selecting circuit 1 and pixels in each selected pixel line are readout one by one as respective sensor signals in such a manner that selecting signals DS1~DS4 successively output from a pixel selecting circuit 2 turn on corresponding switches SW1~SW4 to read respective pixel signals Vo in a time series. In FIG. 9, numeral 4 designates a power source for gate voltage VG of the transistor Q1 and numeral 6 designates a power source for a drain voltage VD of the transistor Q1.

The image sensor is provided with a voltage switching-over circuit 5 by which a drain voltage VD of each transistor Q1 for each pixel is changed from a normal high-level H to an initializing lower level L and reverse by the effect of specified timing pulses when selecting each line of pixels.

Figure 10:
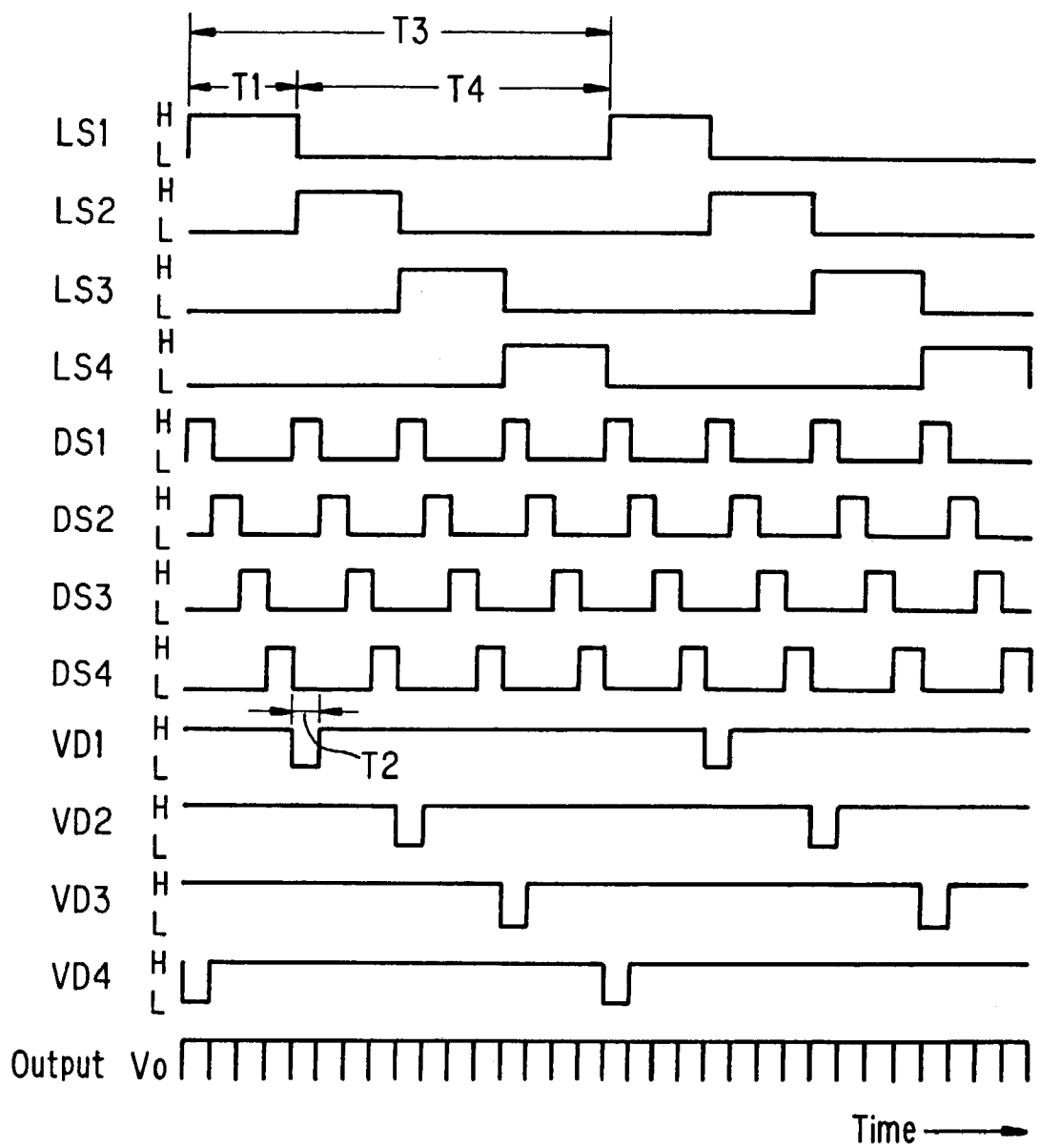
FIG. 10 is a time chart of signals from portions of the image sensor of FIG. 9.

The operation of the above-described image sensor to which the present invention is applied will be described with reference to FIG. 10 showing a time chart of signals generated at respective portions of the image sensor.

Once the pixel-line selecting signal LSI reached the high level H, the first pixel line including pixels D11, D12, D13 and D14 is selected and, during a specified period of the signal LSI remaining at the high level H, pixel selecting signals DS1~DS4 successively reach the high level H to start the successive reading of pixel signals Vo from the pixels D11, D12, D13 and D14.

As soon as the pixel-line selecting signal LS1 was changed to the low level, a next pixel-line selecting signal LS2 is changed to the high level H to select the second pixel line containing pixels D21, D22, D23 and D24. For a specified period T1 of the signal LS2 remaining at the high level, the pixel selecting signals DS1~DS4 successively reach the high level H to start the successive reading of pixel signals Vo from pixels D21, D22, D23 and D24.

Similarly, with the pixel-line selecting signals LS3 (LS4) changed to the high level H, the third (fourth) pixel line is selected and then, for a specified period T1 for which the signal LS3 (LS4) remains at the high level H, the pixel selecting signals DS1~DS4 successively reaches the high level H to start the successive reading of pixel signals Vo from pixels D31, D32, D33 and D34 (D41, D42, D43 and D44).

When the pixel-line selecting signal LS1 was changed to the low level L after the period T1, the drain voltage VD1 for the pixels D11, D12, D13 and D14 in the first selected line is turned to the low level L for a specified period T2 to make the pixels initialized and prepared for the next cycle of reading the pixel signals, which cycle will be performed with elapse of one cycle time T3. When the pixel-line selecting signal LS2 was changed to the low level L after the period T1, the drain voltage VDI for the pixels D21, D22, D23 and D24 in the second selected line is turned to the low level L for the specified period T2 to initialize the pixels for the next sensor-signal reading cycle to be performed with elapse of one cycle time T3.

Similarly, once the pixel-line selecting signal LS3 (LS4) was changed to the low level L after the period T1, the drain voltage VD3 (VD4) for the pixels in the third (fourth) selected line is turned to the low level L to initialize the pixels for the next sensor-signal reading cycle to be performed with elapse of one cycle time T3.

Although the drain voltage VDX is turned to the low level L to initialize each pixel circuit with the pixel-line selecting signal LSX (X=1~4) decreased to the low level with elapse of the period T1, the initializing timing may be within the duration T4 for which the pixel line selection is paused with the pixel-line selecting signal LSX being at the Low level L.

The timing of occurrence of signals at respective portions is decided by driving the pixel-line selecting circuit 1, the pixel selecting circuit 2 and the voltage switching-over circuit 5 under the control from a control circuit (not shown).

Initializing each pixel at the timing adapted to scanning for reading each pixel signal may avoid an over or short charge-accumulating duration for a whole system of the image sensor.

Thus, according to the present invention, it is possible to realize an image sensor having a wide dynamic range of its logarithmic output characteristic without causing the afterglow of the pixels.

The present invention provides an output compensating device for compensating for variations in the output characteristics of the light sensor circuits of the above-described image sensor. To compensate for variations in output characteristics of every pixel signal, which variations may be derived from the structural variations and the temperature characteristic variations of the respective light sensor circuits composing the image sensor, the output compensating device carries out optimal compensation of every pixel signal in such a manner that each pixel signal is processed first by offset compensation and output, if the offset-compensated signal has a characteristic in a given logarithmic response region, but, if the offset-compensated signal has a characteristic in a non-logarithmic response region, it is further processed by gain compensation and then output.

Figure 11:
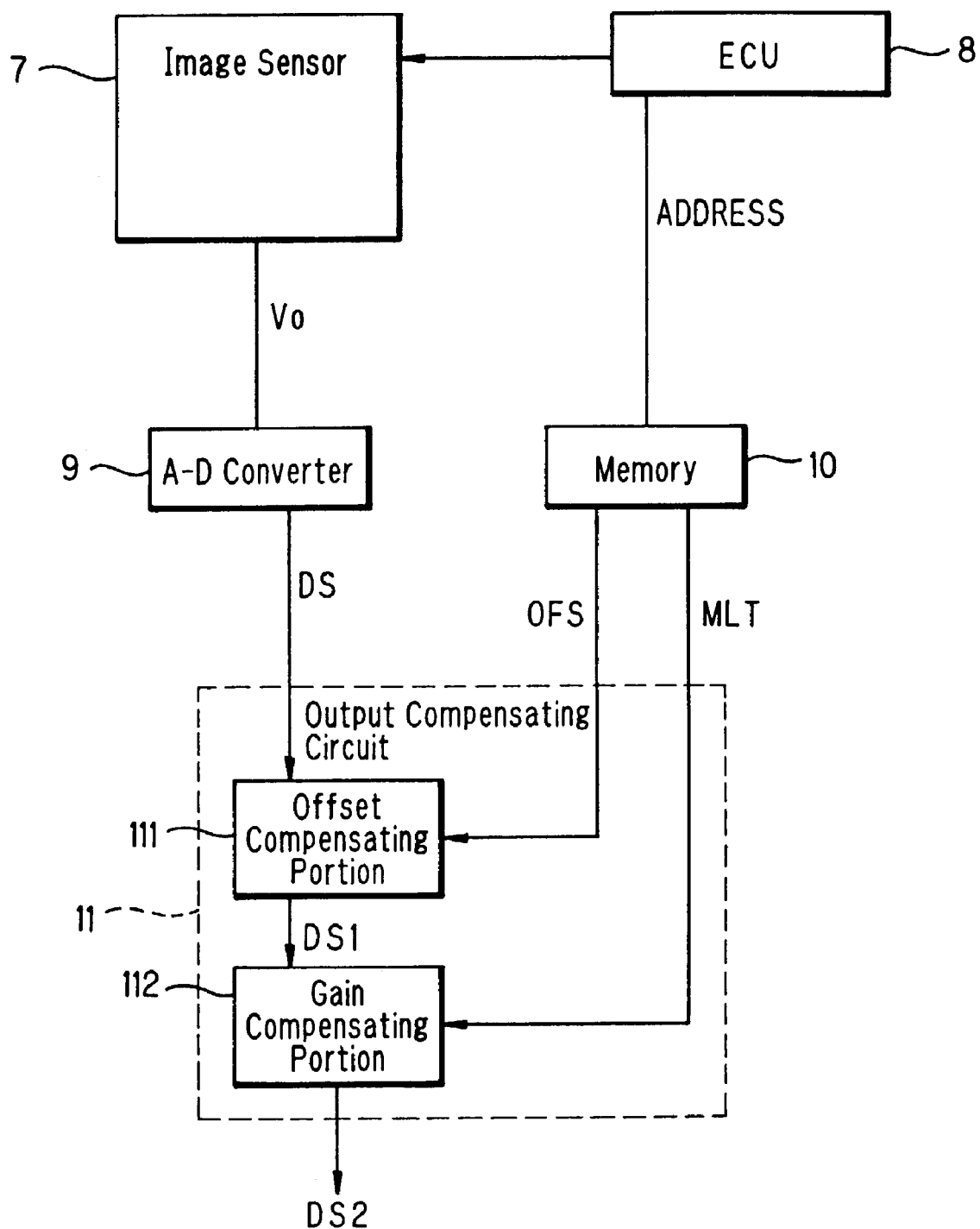
FIG. 11 is a block diagram of an output compensating device for an image sensor according to an embodiment of the present invention.

FIG. 11 shows a basic construction of an output compensating system for conducting offset and gain compensations for variations in output characteristics of pixel signals, which variations were derived from the structures of corresponding light sensor circuits.

This system comprises an image sensor 7 (having a construction shown in FIG. 9), an ECU 8 for controlling the operation for reading pixel signals in a time series, an A-D converter 9 for converting pixel signals Vo outputted in a time series from the image sensor 7 into corresponding digital signals, a memory 10 for storing offset compensation values OFS predetermined for output characteristics of pixels (light sensor circuits) and multipliers MLT for gain compensation, both of which can be selected in accordance with an address signal ADDRESS (X, Y) of a pixel to be processed, and an output compensating circuit 11 for performing arithmetic operations necessary for the offset and gain compensations of the digitized pixel signals using corresponding offset compensation values OFS and multipliers MLT read from the memory 10.

Figure 13:
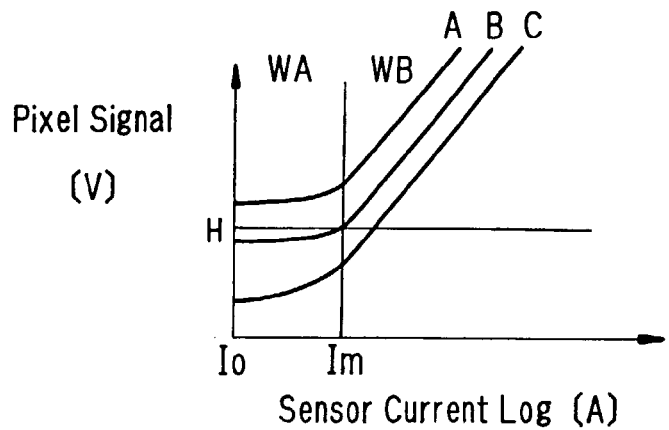
FIG. 13 shows exemplary variations in output characteristics of pixel signals from the image sensor, which variations were derived from the structure of respective light sensor circuits of the image sensor.

FIG. 13 shows an example of different output characteristics of three pixel signals A, B and C, which differences were caused from the structure-derived variations in the output characteristics of corresponding light sensor circuits. In the shown example, a sensor current value Im corresponding to a threshold H of an pixel output represents a point at which characteristics of pixel signals A, B and C change from a non-logarithmic response region to a logarithmic response region. Io designates a dark current in a sensor when it is not illuminated.

According to the present invention, the compensation of outputs of the image sensor is normally conducted when the output characteristics of respective pixel signals have the same gradient in the logarithmic response region WB but they are different in shape from each other in the non-logarithmic response region. Parameters for each pixel signal are information about the point at which its characteristic changes from the non-logarithmic response region to the logarithmic response region and a pixel output appearing at a dark sensor current.

Figure 12:
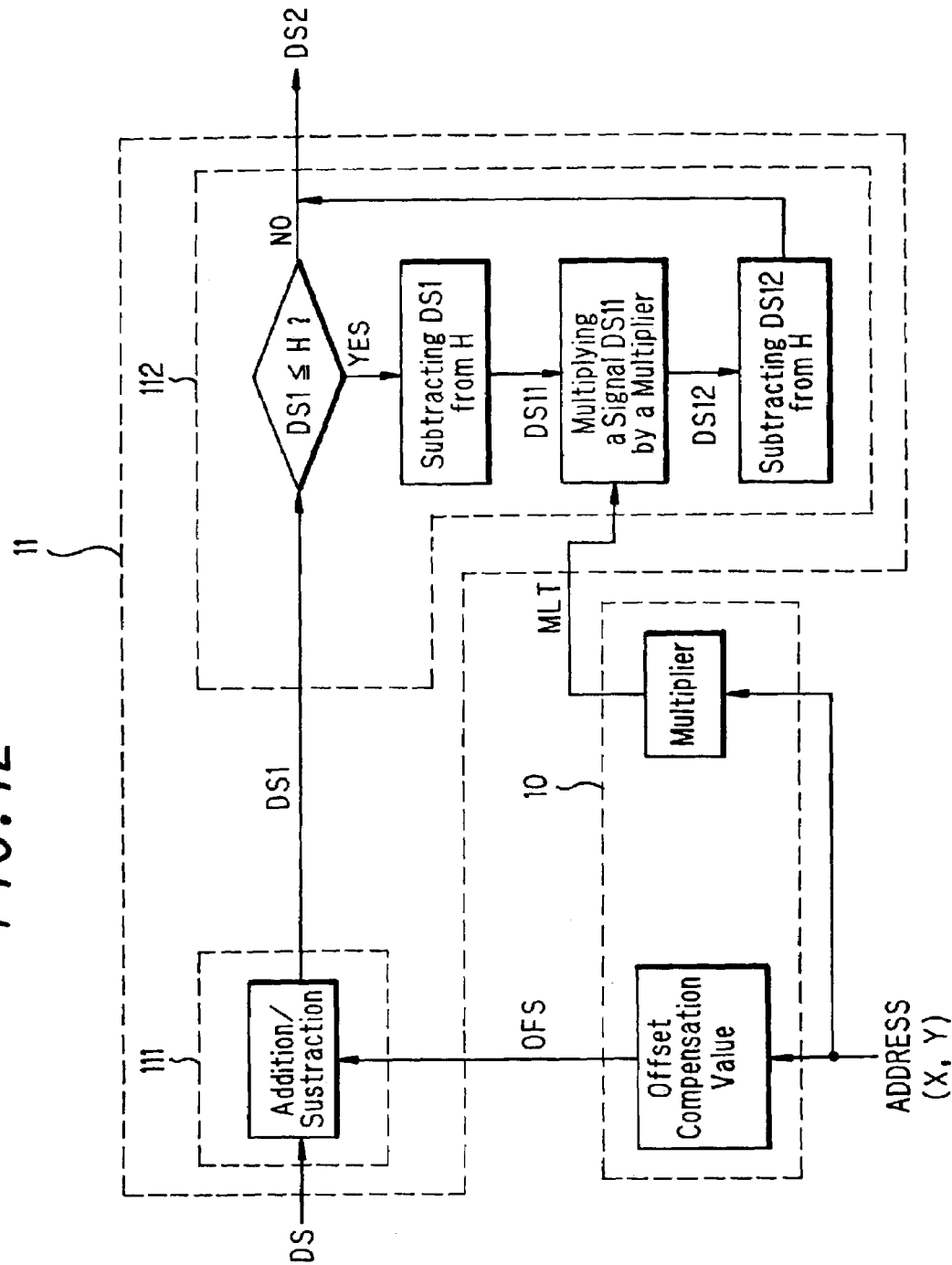
FIG. 12 is a flowchart depicting the operation of the output compensating device of FIG. 11.

FIG. 12 illustrates the operation of the output compensating circuit 11.

Figure 14:
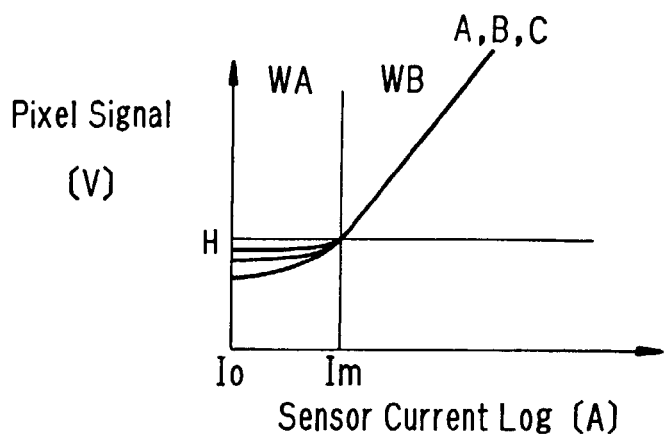
FIG. 14 shows output characteristics of pixel signals, which were obtained by offset compensation of the signals having the output characteristics shown in FIG. 13.

In the memory 10, there is a table of offset compensation values OFS for correcting outputs of respective pixel signals so as to attain a value H at a sensor current of Im. In an offset compensating portion 111, the digitized pixel signals DS are corrected by arithmetic operations (addition, subtraction) using corresponding offset compensation values OFS. As the result of the offset compensation, the three pixel signals (A, B and C) have the same characteristic in the logarithmic response region WB as shown in FIG. 14.

In a gain compensating portion 112, the gain compensation of output characteristics of three pixel signals in the non-logarithmic response region WA below the threshold value H is conducted by arithmetic operations (multiplication) using corresponding multipliers based on the offset-compensated signals DS1.

In practice, the offset-compensated pixel signal DSI is checked whether it is smaller than the threshold value H and, if so (i.e., the signal is in the non-logarithmic region WA), it is further subjected to gain compensation by the following arithmetic operations using a specified multiplier MLT selected from the memory 10.

Output←H−(H−Pixel Signal DSI)×Multiplier

A resultant signal is output as an output-compensated pixel signal DS2.

Figure 15:
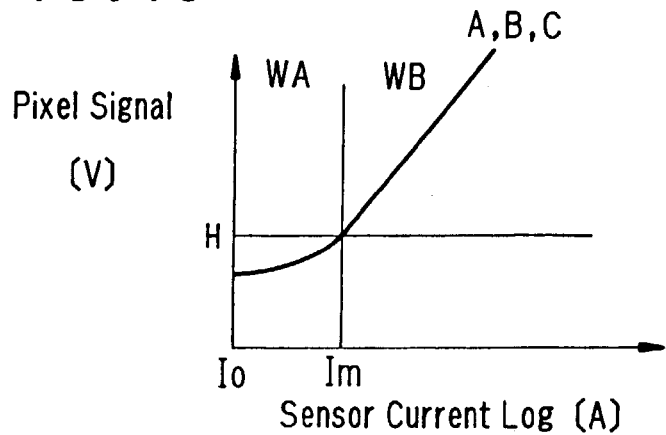
FIG. 15 shows output characteristics of pixel signals, which were obtained by offset and gain compensations of the signals having the output characteristics shown in FIG. 13.

As the result of the above-described gain compensation, the three pixel signals A, B and C have the same characteristics in the non-logarithmic response region WA as shown in FIG. 15. In this instance, the offset-compensated pixel signal DS1 being larger than the threshold value (i.e., in the logarithmic response region WB) is directly output as an output-compensated digital pixel signal DS2.

Figure 16:
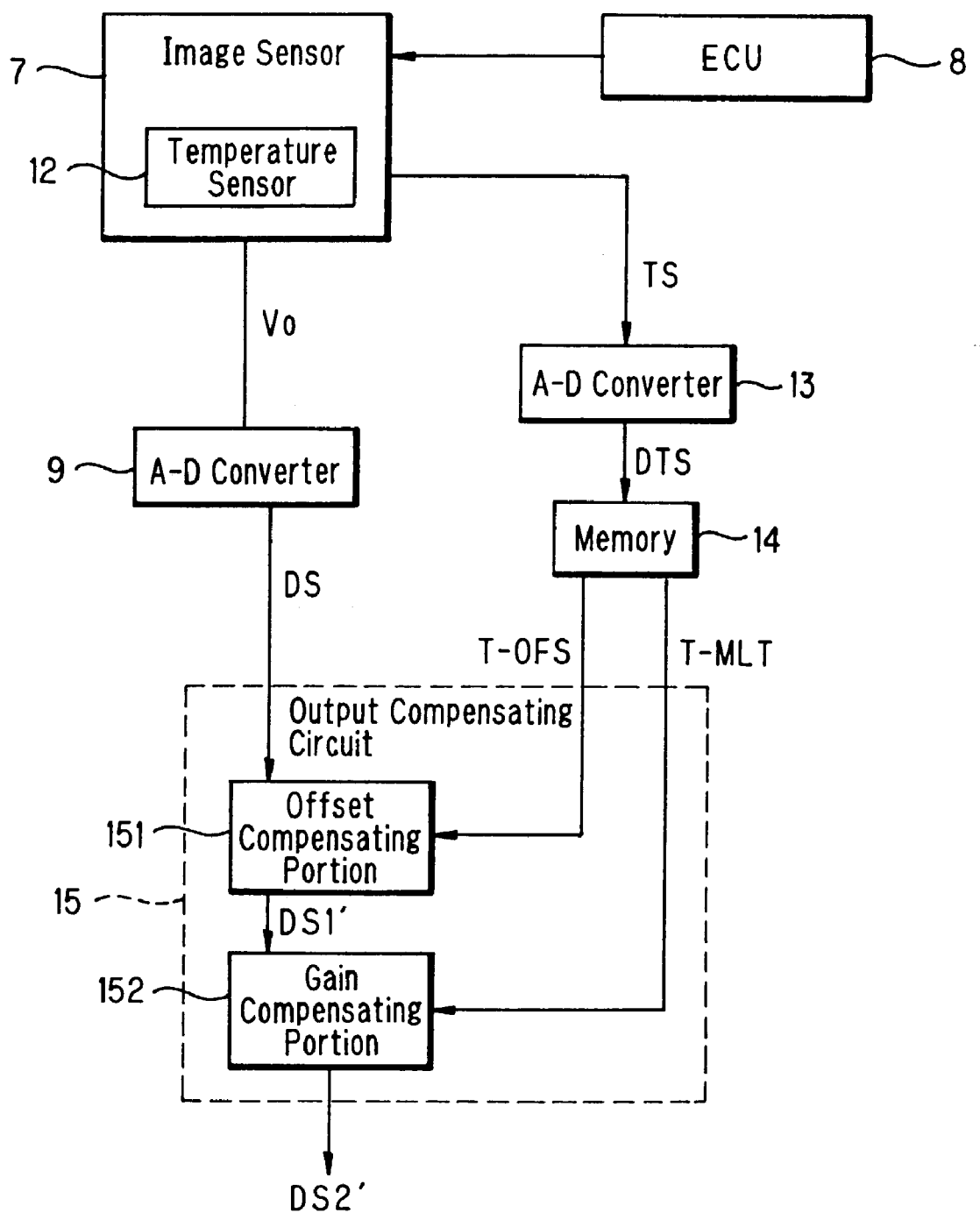
FIG. 16 is a block diagram of an output compensating device for an image sensor according to another embodiment of the present invention.

FIG. 16 shows a basic construction of a system for compensating pixel signals for offset values and gain levels, which differences were resulted from variations in temperature characteristics of corresponding pixel circuits.

The system comprises an image sensor 7 incorporating a temperature sensor 12, an ECU 8 for performing the control of reading pixel signals Vo from respective pixel circuits in a time series and temperature detection signals TS from the temperature sensor 12 at a specified timing, an A-D converter 9 for converting pixel signals Vo output in a time series from the image sensor 7 into corresponding digital signals, an A-D converter 13 for converting the temperature detection signals TS read from the temperature sensor 12 into corresponding digital signals, a memory 14 for storing offset compensation values T-OFS predetermined for temperature characteristics of respective pixel circuits and multipliers T-MLT for gain compensation, which values can be selected in accordance with the digitized temperature detection signal DTS, and an output compensating circuit 15 for performing arithmetic operations necessary for the offset compensation and gain compensation of the digitized pixel signal using a corresponding offset compensation value OFS and multiplier MLT read from the memory 14.

Figure 18:
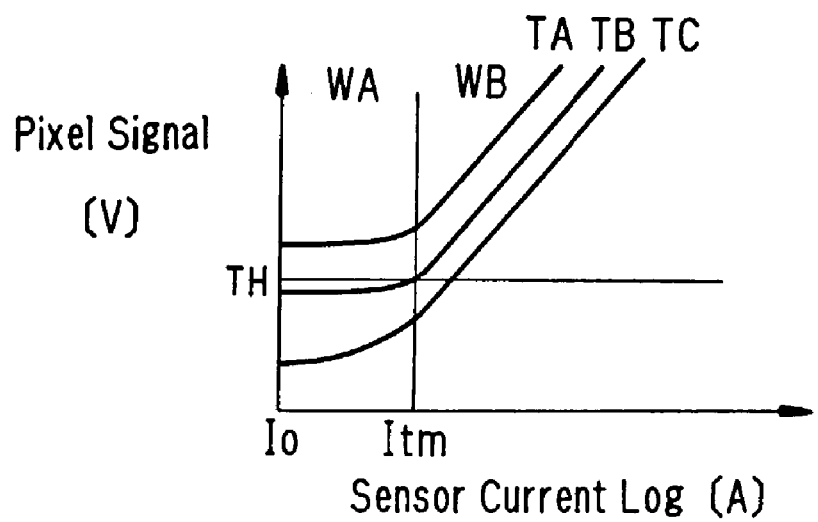
FIG. 18 shows exemplary variations in output characteristics of pixel signals from an image sensor, which variations were derived from variations in temperature characteristics of respective light sensor circuits of the image sensor.

FIG. 18 shows exemplary variations in output characteristics of respective pixel signals in accordance with temperatures TA, TB and TC. In the shown example, a sensor current value ltm corresponding to a pixel output threshold TH represents a point at which pixel signals corresponding to temperatures TA, TB and TC change from a non-logarithmic response region WA to a logarithmic response region WB. Io designates a dark current in a sensor when it is not illuminated.

According to the present invention, the compensation of outputs of the image sensor is normally conducted when the output characteristics of respective pixel signals have the same gradient in the logarithmic response region WB but they are different in shape from each other in the non-logarithmic response region WA. Parameters for the pixel signals are information about the point at which characteristics of pixel signals corresponding to the temperatures (TA, TB and TC) change from the non-logarithmic response region WA to the logarithmic response region WB and the pixel output with a dark sensor current.

Figure 17:
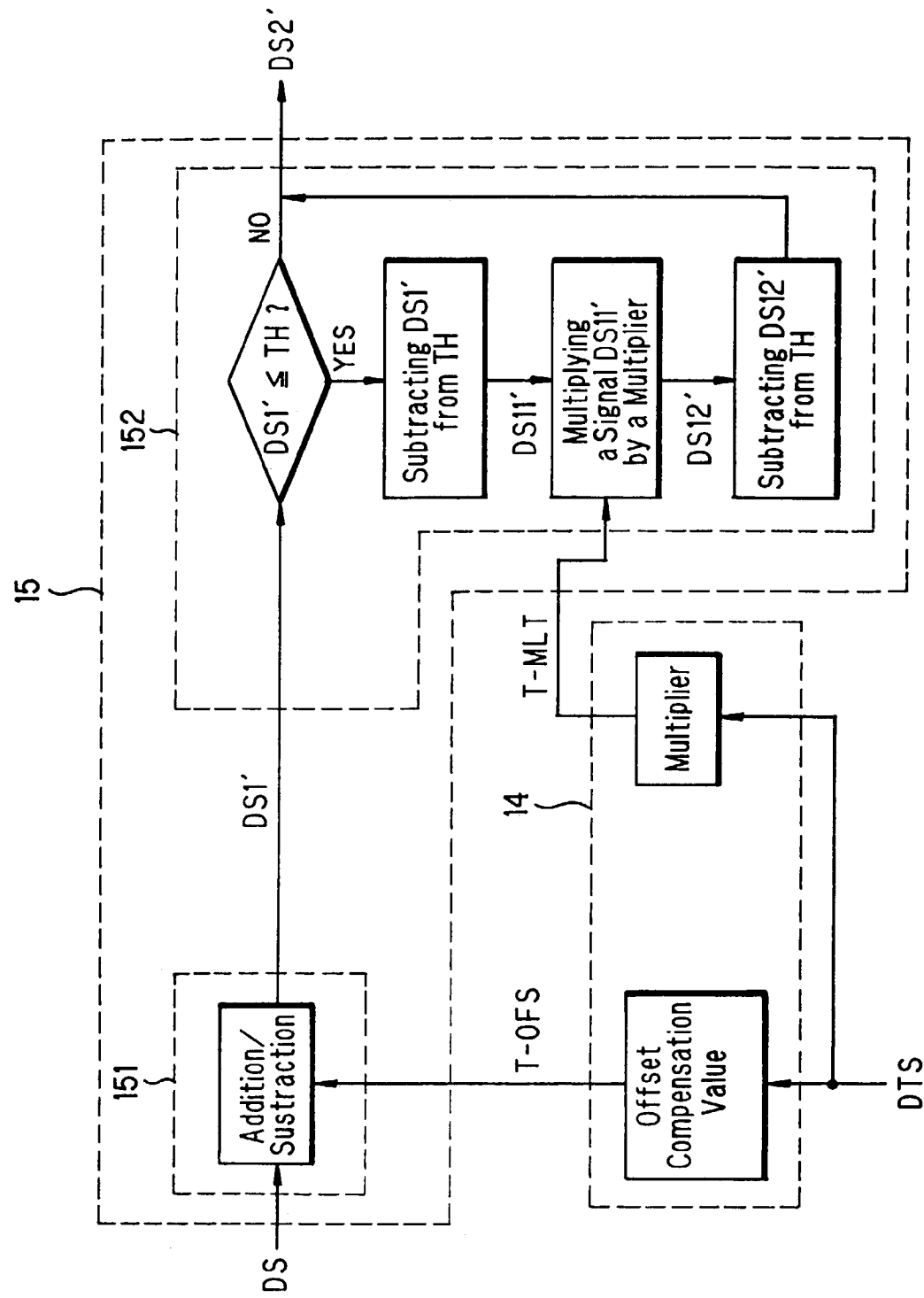
FIG. 17 is a flowchart depicting the operation of the output compensating device of FIG. 16.

FIG. 17 illustrates the operation of the output compensating circuit 15.

Figure 19:
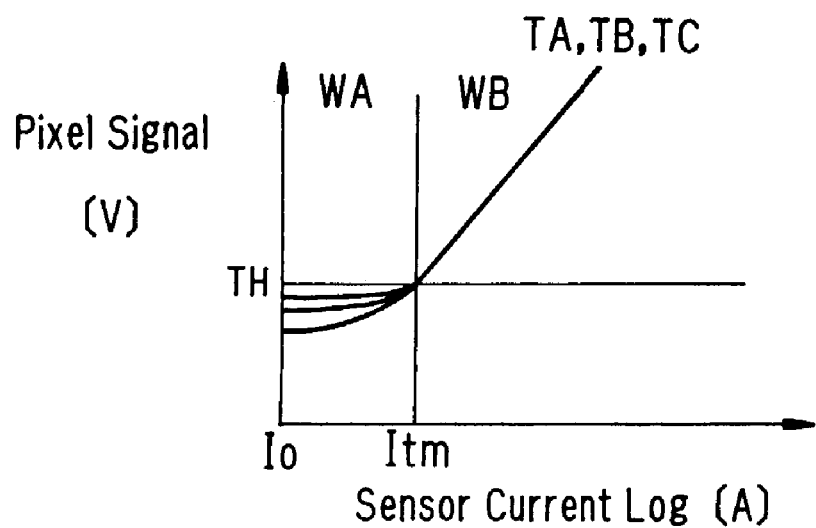
FIG. 19 shows output characteristics of pixel signals, which were obtained by offset compensation of temperature characteristics of the signals having the output characteristics shown in FIG. 18.

In the memory 14, an offset compensation value T-OFS for obtaining the pixel output of the threshold value TH at the sensor current of Im. In an offset compensating portion 151, the digitized pixel signals DS are processed by arithmetic operations (addition, subtraction) using the offset compensation value T-OFS. As the result of the offset compensation, three pixel signals corresponding to the temperatures TA, TB and TC have the same characteristics in the logarithmic response region WB as shown in FIG. 19.

In a gain compensating portion 152, the gain compensation of characteristics of the pixel signals in the logarithmic response region WB above the threshold value TH is conducted by arithmetic operations (multiplication) using a corresponding multiplier based on the offset compensated signal DS1'.

In practice, the offset-compensated pixel signal DS1' is checked whether it is smaller than the threshold value T-TH and, if so, it is further subjected to gain compensation by conducting the following arithmetic operations using a specified multiplier T-MLT selected from the memory 14.

Output←TH−(TH−Pixel Signal DS1)×Multiplier

A resultant signal is output as an output-compensated digital pixel signal DS2'.

Figure 20:
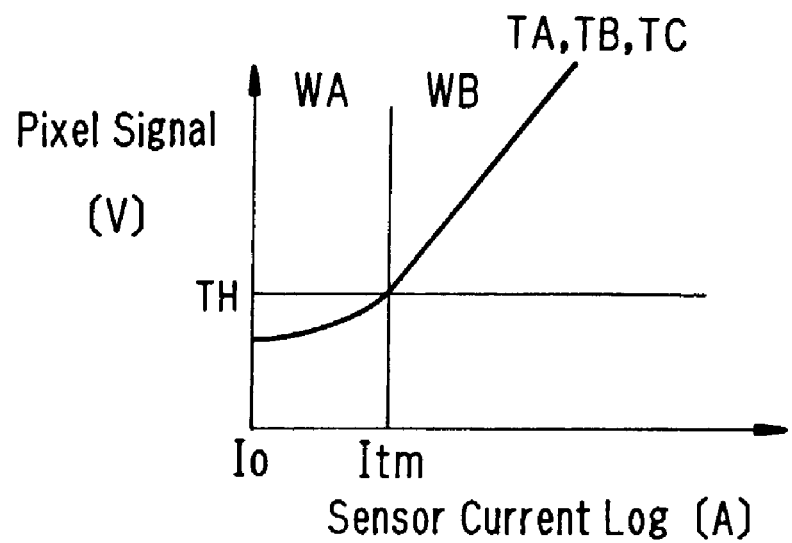
FIG. 20 shows output characteristics of pixel signals, which were obtained by offset compensation and gain compensation of temperature characteristics of the signals having the output characteristics shown in FIG. 18.

As the result of the gain compensation, the three pixel signals corresponding to temperatures TA, TB and TC have the same characteristic in the non-logarithmic response region WA as shown in FIG. 20. In this instance, the offset-compensated pixel signal DS1' being larger than the threshold value TH is directly output as an output-compensated digital pixel signal DS2'.

The output compensating device for the image sensor according to the present invention conducts the offset and gain compensations for variations in the output characteristics of pixel signals, which variations resulted from the structures of pixel circuits, and the offset and gain compensations for variations in the temperature characteristics of the same pixel signals so that the pixel signals of the image sensor being free from the effects of both kinds of characteristic variations of the pixel circuits can be obtained.

Figure 21:
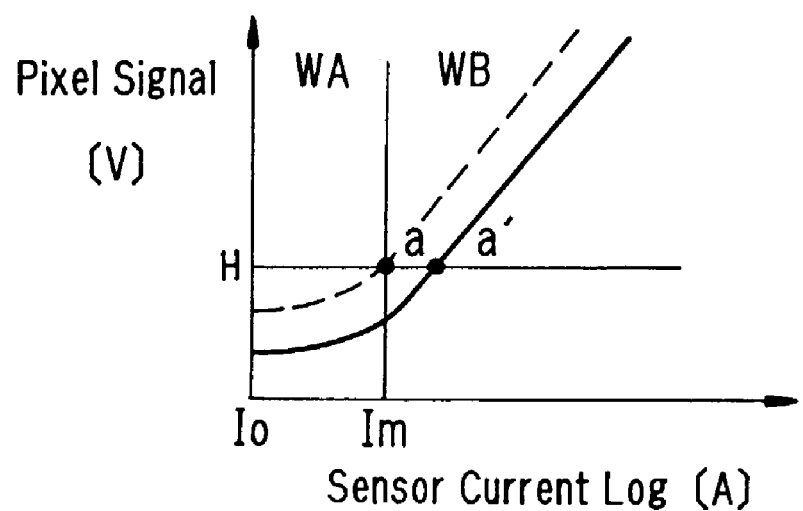
FIG. 21 shows two output characteristics of pixel signals, one of which is obtained with no effect of a temperature offset and other is affected by a temperature offset.

If a pixel signal affected by both kinds of the characteristic variations was compensated first for variations in output characteristics by the offset and gain compensations according to the method shown in FIG. 12 and then compensated for variations in temperature characteristics by the offset and gain compensations according to the method shown in FIG. 17, the compensated pixel signal may not completely be compensated because the above compensation was made without compensation for the variation caused by a change in temperature. In other words, conducting the offset and gain compensations of the pixel signal for the structure-derived variation in its output characteristic in respective regions with a boundary of a threshold level H, no problem may arise as far as the pixel signal is not subjected to the effect of a change in temperature as shown by a dot line in FIG. 21. However, if the signal was subjected to a temperature offset as shown by a solid line in FIG. 21, the compensation region boundary point is shifted to a position a' since the level H is fixed. As a result, the compensation was made in a different irregular way. In the shown case, the output characteristic of the pixel signal is shifted downward, resulting in shifting the level H above the boundary between the non-logarithmic response region and the logarithmic response region.

The above-described problem can be solved by the present invention in such a manner that the level H is aligned with the boundary between the non-logarithmic response region and the logarithmic response region by conducting the offset compensation for variations in temperature characteristics of respective pixel signals before conducting the gain compensations for structure-derived variations in output characteristics of the pixel signal.

The same kind of problem may arise when conducting the offset and gain compensations for variations in temperature characteristics and then the offset and gain compensations for structure-derived variations in output characteristics of respective pixel signals. In this case, the level TH must be aligned with the boundary between the non-logarithmic response region and the logarithmic response region by conducting the offset compensation for the structure-derived variation in the output characteristics of each pixel signal before conducting the offset compensation for the variation in temperature characteristic of each pixel signal.

Figure 22:
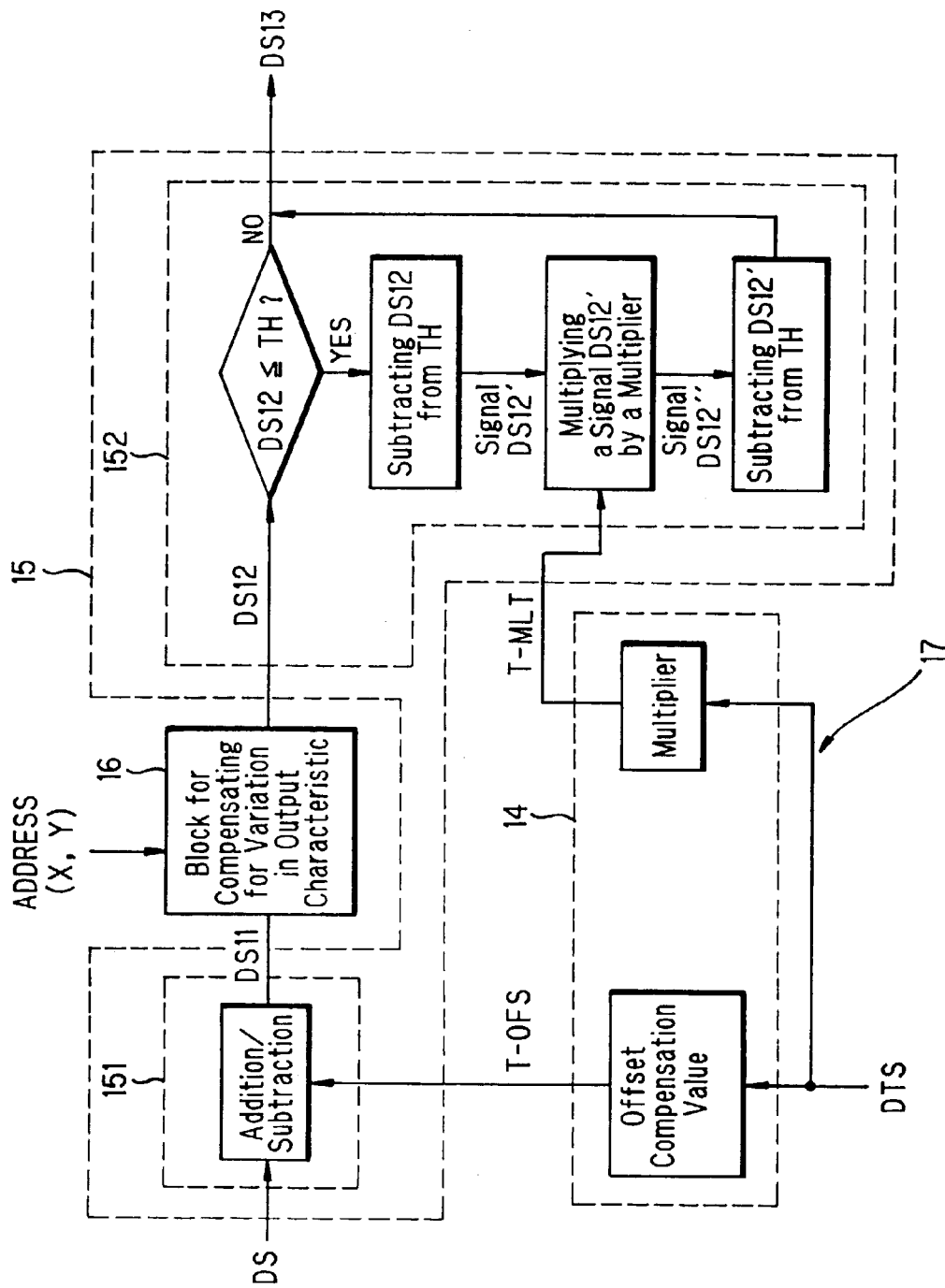
FIG. 22 shows an exemplary construction of an output compensating portion of an output compensating device according to the present invention.

FIG. 22 shows a procedure for conducting the offset compensation of each pixel signal for a variation in temperature characteristic, the gain compensation for a structure-derived variation in output characteristic and then the offset and gain compensation for variations in temperature characteristic.

In FIG. 22, a block 16 is similar to the processing block 11 shown in FIG. 12 for conducting the offset and gain compensation for a variation in the output characteristic of each pixel signal, and a block 17 is similar to the processing block 15 shown in FIG. 17 for conducting the offset and gain compensation for a variation in the temperature characteristic of each pixel circuit. In this case, a pixel signal DS from the image sensor is digitized and transferred to an offset compensation block 151 on the side of the temperature characteristic compensation block 17, whereby the pixel signal DS is subjected to the offset compensation for its temperature characteristic variation to attain a correct level H necessary for compensating for the output characteristic variation of the pixel signal. The offset-compensated pixel signal DS11 is then transferred to the processing block 16, whereby it is suitably compensated for variation in its output characteristic by the offset and gain compensations. The offset- and gain-compensated pixel signal DS12 from the block 16 is transferred to a gain compensation block 152 on the side of processing block 17, whereby the signal is compensated by the gain compensation for its temperature characteristic variation. Finally, the pixel signal DS13 compensated for variations in output and temperature characteristics is obtained.

Figure 23:
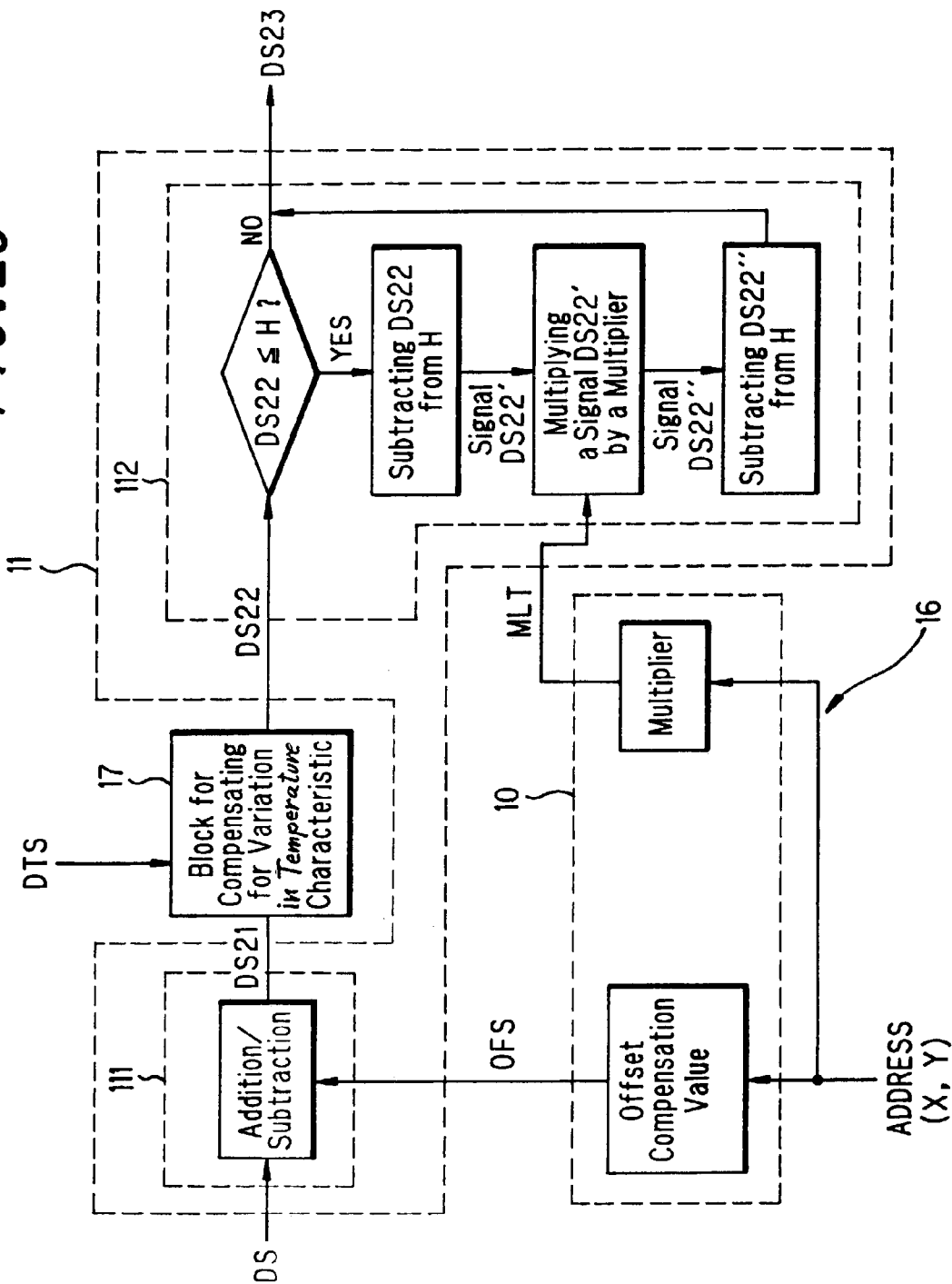
FIG. 23 is another exemplary construction of an output compensating portion of an output compensating device according to the present invention.

FIG. 23 shows a procedure for conducting the offset compensation for a structure-derived variation in the output characteristic of a pixel signal, the offset and gain compensations for a variation in its temperature characteristic and then the gain compensations for a variation in its output characteristic. In FIG. 23, a block 16 is similar to the processing block 11 shown in FIG. 12 for conducting the offset and gain compensation for a variation in the output characteristic of each pixel signal, and a block 17 is similar to the processing block 15 shown in FIG. 17 for conducting the offset and gain compensation for variations in the temperature characteristic of each pixel signal.

In this instance, a pixel signal DS from the image sensor 7 is digitized and transferred to an offset compensation block 111 on the side of the output characteristic compensation block 16, whereby the pixel signal is subjected to the offset compensation for a variation in its output characteristic to attain a correct level TH necessary for compensating the variation in the temperature characteristic of the pixel signal. The offset-compensated pixel signal DS21 is transferred to the processing block 17, whereby it is adaptively compensated for its temperature characteristic variation by the offset and gain compensations. The compensated pixel signal DS22 from the block 17 is transferred to a gain compensation block 112 on the side of processing block 16, whereby the signal is subjected to the gain compensation for its output characteristic variation. This process produces a pixel signal DS23 compensated for the variations in both output and temperature characteristics.

Figure 25:
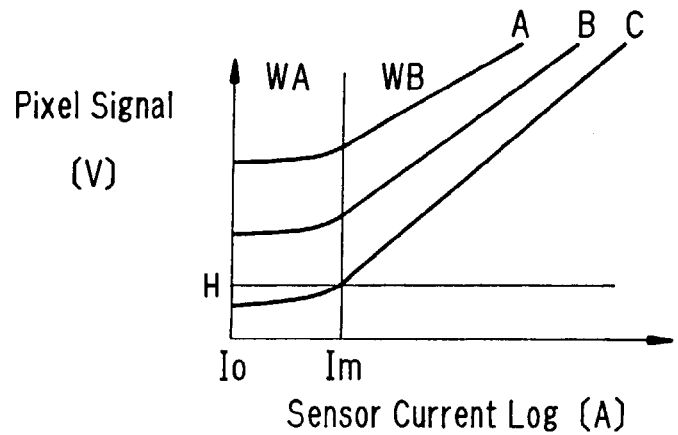
FIG. 25 shows another exemplary variations of output characteristics of pixel signals, which variations were derived from the structure of respective pixel circuits of an image sensor.

FIG. 25 shows an example of different output characteristics of three pixel signals A, B and C, which may be resulted from the structure-derived variations of corresponding light sensor circuits. In FIG. 25, a sensor current value Im corresponding to a pixel output threshold H represents a point at which each of pixel signals A, B and C changes from a non-logarithmic response region to a logarithmic response region. Io designates a dark current in the light sensor when it is not illuminated.

According to the present invention, the compensation of output signals of the image sensor is normally conducted when the output characteristics of respective pixel signals are substantially the same in shape in the non-logarithmic response region but have different gradients in the logarithmic response region WB. Parameters for each pixel signal are information about the point at which its characteristic changes from the non-logarithmic response region to the logarithmic response region and a pixel output at a dark sensor current.

Figure 24:
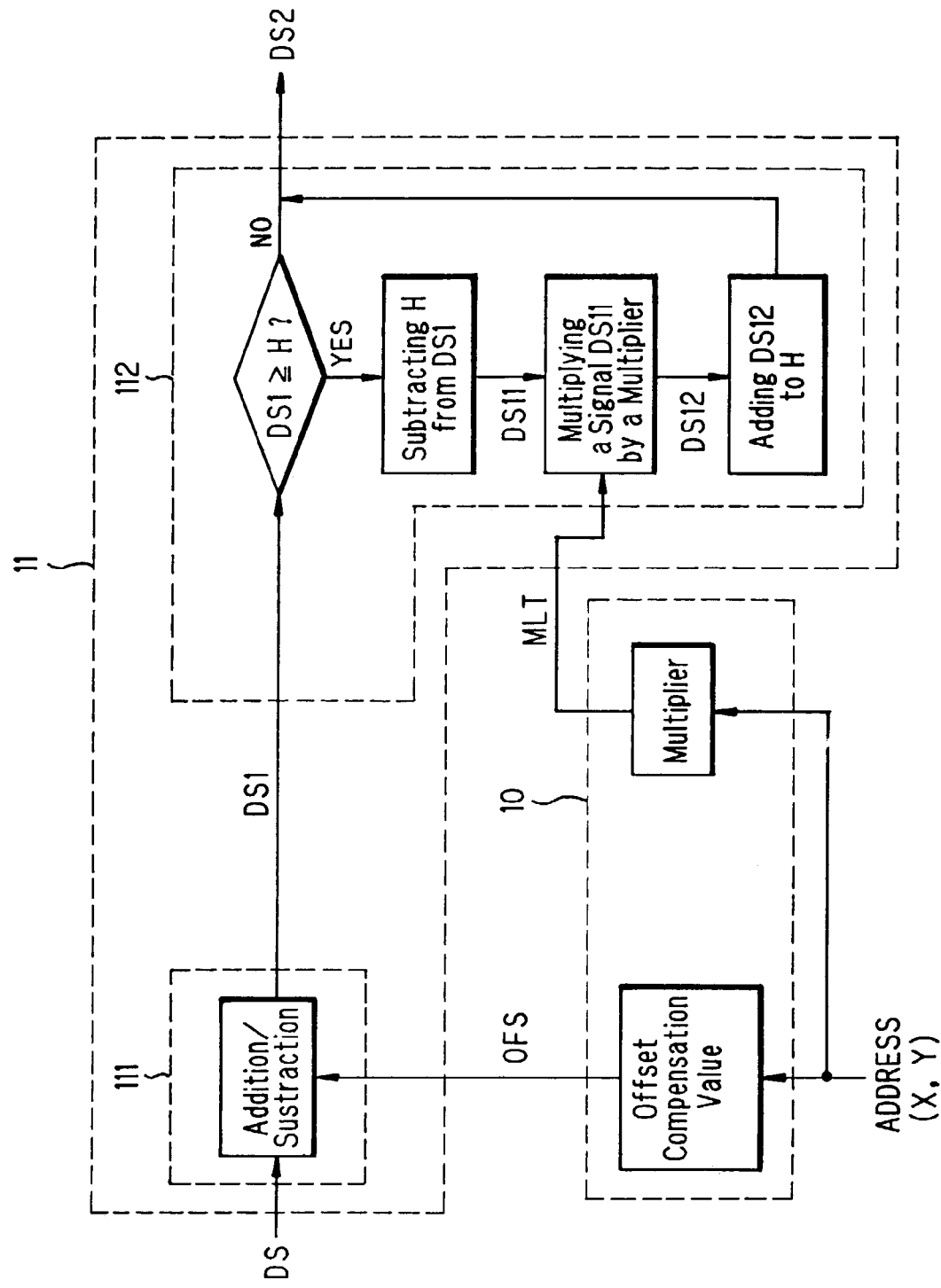
FIG. 24 is another exemplary flowchart depicting the operation of an output compensating circuit of an output compensating device according to an embodiment of the present invention.

FIG. 24 illustrates the operation of the output compensating circuit 11.

Figure 26:
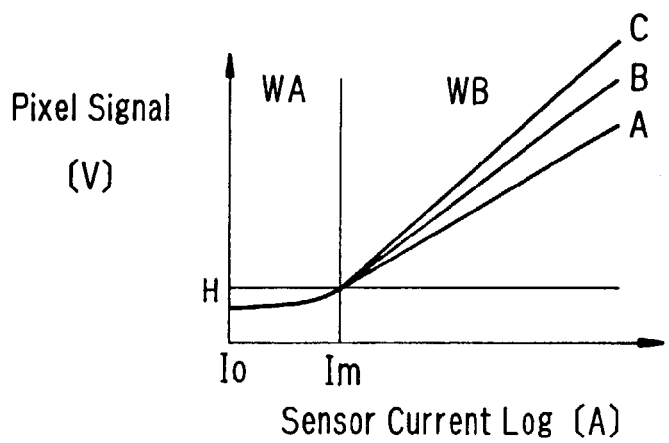
FIG. 26 shows output characteristics of pixel signals, which were obtained by offset compensation of the signals having the output characteristics shown in FIG. 25.

A memory 10 holds an offset-compensation value OFS preset for obtaining a pixel output of H at a sensor current value Im. In an offset compensating portion 111, the offset compensation of the digitized pixel signals DS are made by arithmetic operations (addition, subtraction) using the offset compensation value OFS. As the result of the offset compensation, the three pixel signals (A, B and C) have the same characteristic in the non-logarithmic response region WA as shown in FIG. 26. In a gain compensating portion 112, the gain compensation for variations in characteristics of the three pixel signals in the logarithmic response region WB above the threshold value H is conducted by arithmetic operations (multiplication) by using corresponding multipliers based on the offset compensated signals DS1.

In practice, the offset-compensated pixel signal DS1 is checked whether it is no less than the threshold value H and, if so (i.e., it lies in the logarithmic response region WB), it is further subjected to the gain compensation by the following arithmetic operations using a specified multiplier MLT selected from the memory 10.

Output←H+(Pixel Signal DS1−H)×Multiplier

A resultant signal is output as an output-compensated pixel signal DS2.

Figure 27:
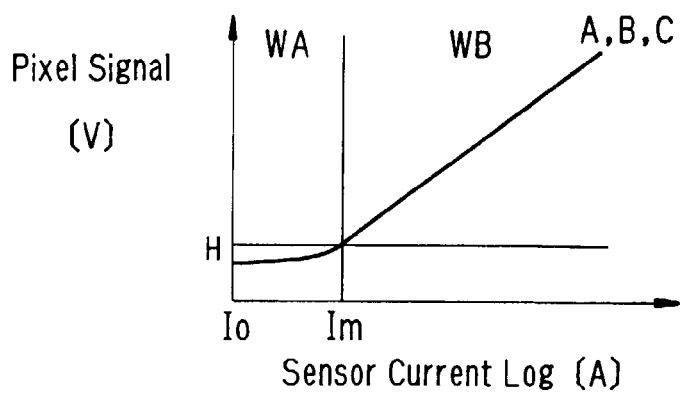
FIG. 27 shows output characteristics of pixel signals, which were obtained by offset compensation and gain compensation of the signals having the output characteristics shown in FIG. 25.

As the result of gain compensation, the three pixel signals A, B and C have the same characteristics in the logarithmic response region WB as shown in FIG. 27. In this instance, the offset-compensated pixel signal DS1 being smaller than the threshold value (i.e., in the non-logarithmic response region WA) is directly output as a digital output-compensated pixel signal DS2.

Figure 29:
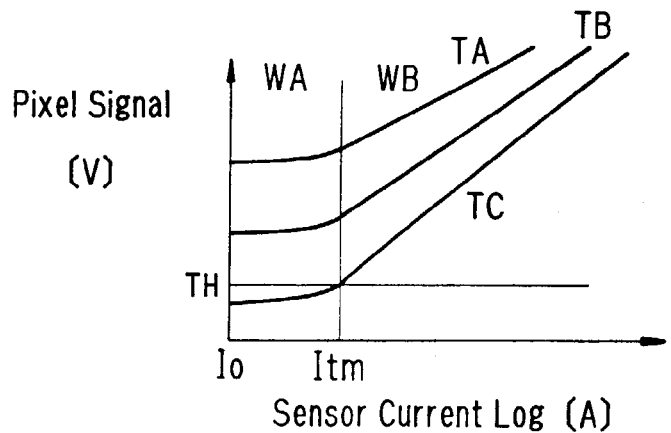
FIG. 29 shows another exemplary variations in output characteristics of pixel signals from an image sensor, which variations may be caused from variations in temperature characteristic of respective light sensor circuits.

FIG. 29 shows another example of different output characteristics of three pixel signals A, B and C, which may be caused from the structure-derived variations of corresponding light sensor circuits. In FIG. 29, a sensor current value Itm corresponding to a pixel output threshold TH represents a point at which each of pixel signals A, B and C changes from a non-logarithmic response region to a logarithmic response region. Io designates a dark current in the light sensor when it is not illuminated.

According to the present invention, the compensation of output signals of the image sensor is normally conducted when the output characteristics of respective pixel signals have substantially the same shape in the non-logarithmic response region WA and different gradients in the logarithmic response region WB. Parameters for each pixel signal are information about the point at which its characteristic changes from the non-logarithmic response region WA to the logarithmic response region WB and a pixel output at a dark sensor current.

Figure 28:
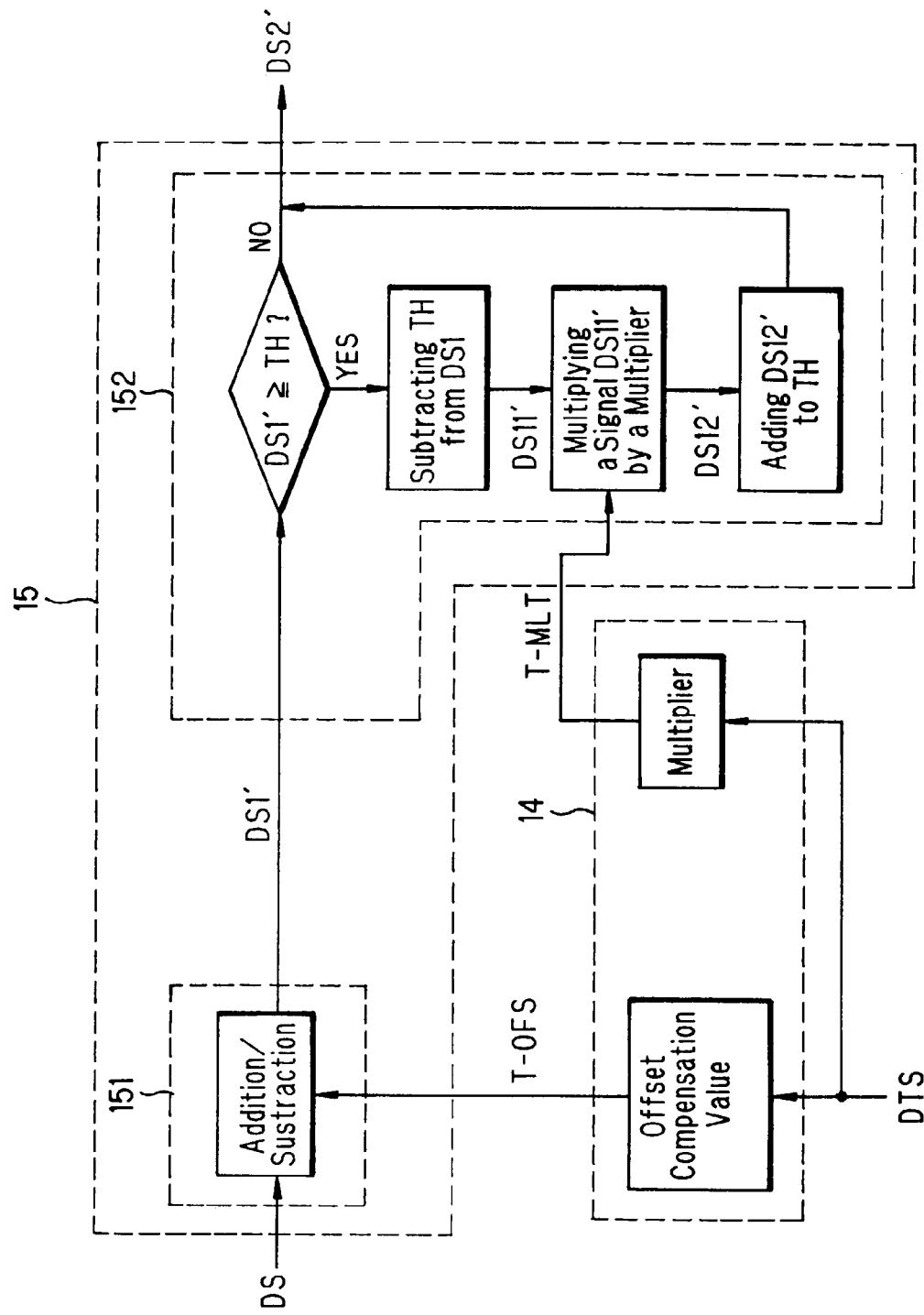
FIG. 28 is another exemplary flowchart depicting the operation of another output compensation circuit according to another embodiment of the present invention.

FIG. 28 illustrates the operation of the output compensating circuit 15.

Figure 30:
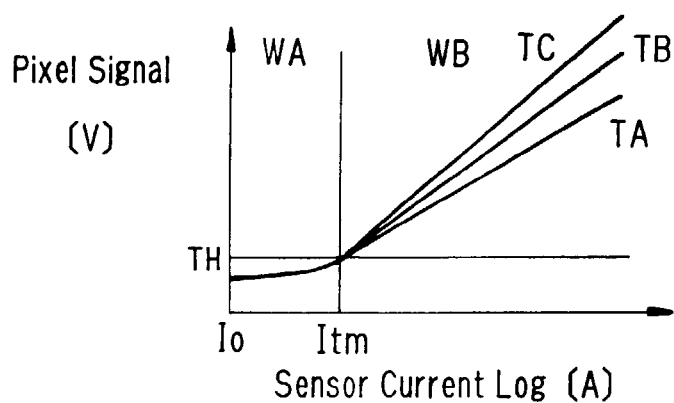
FIG. 30 shows output pixel signal characteristics obtained by offset compensation of temperature characteristics of the signals having the output characteristics shown in FIG. 29.

The memory 14 holds an offset-compensation value T-OFS preset for obtaining a pixel output of TH at a sensor current value Itm. In an offset compensating portion 151, the digitized pixel signals DS are offset compensated by arithmetic operations (addition, subtraction) using the offset compensation values T-OFS. As the result of the offset compensation, the three pixel signals (A, B and C) have the same characteristics in the non-logarithmic response region WA as shown in FIG. 30.

In a gain compensating portion 151, the gain compensation for variations in characteristics of the three pixel signals in the logarithmic response region WB above the threshold value TH is conducted by arithmetic operations (multiplication) using corresponding multipliers based on the offset compensated signal DS1'.

In practice, the offset-compensated pixel signal DS1' is examined whether it is not less than the threshold value TH and, if so, it is further processed by the gain compensation by the following arithmetic operations using a specified multiplier T-MLT selected from the memory 14.

Output←TH+(Pixel Signal DS1−TH)×Multiplier

A resultant signal is output as an output-compensated digital pixel signal DS2'.

Figure 31:
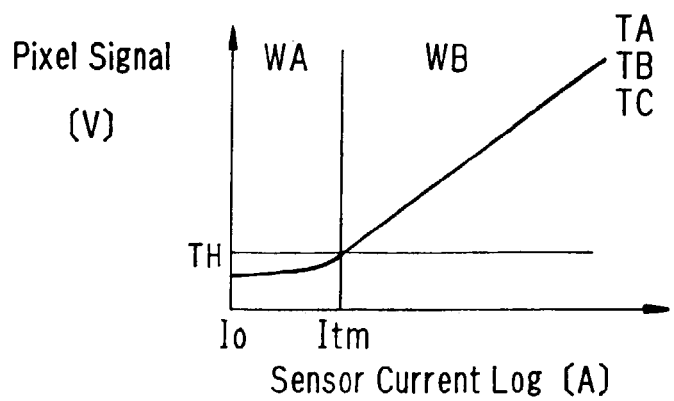
FIG. 31 shows output characteristics of pixel signals obtained by offset compensation and gain compensation of temperature characteristics of the signals having the output characteristics shown in FIG. 29.

As the result of the gain compensation, the three pixel signals corresponding to temperatures TA, TB and TC have the same characteristics in the logarithmic response region WB as shown in FIG. 31. In this instance, the offset-compensated pixel signal DS1' being smaller than the threshold value TH is directly output as a digital pixel signal DS2'.

The output compensating device for the sensor image sensor according to the present invention conducts the offset compensation and gain compensation for variations in the output characteristics of pixel signals, which variations may result from the structures of corresponding pixel circuits, and the offset compensation and gain compensation for variations in temperature characteristics of the same pixel signals, which variations may be derived from the temperature characteristic variations of the corresponding pixel circuits, so that the pixel signals of the image sensor being free from the effects of both kinds of characteristic variations of the pixel circuits can be obtained.

If a pixel signal subjected to the effect of both kinds of the characteristic variations was processed by the offset and gain compensations for the structure-derived variation in its output characteristic for example by applying the method shown in FIG. 24 and then processed by the offset and gain compensations for the variation in its temperature characteristic for example by applying the method shown in FIG. 28, the compensated pixel signal may not completely be compensated since the compensation was made without compensation for variation caused by a change in temperature. In other words, conducting the offset and gain compensations of the pixel signal for the structure-derived variation in its output characteristic in respective regions with a boundary of a threshold level H, no problem may arise as far as the pixel signal was not subjected to the effect of a change in temperature as shown by a dot line in FIG. 21. However, if the signal was affected by a change in temperature as shown by a solid line in FIG. 21, the compensation changing point may be shifted from the position a to the position a' since the level H is fixed. As a result, the compensation could not be carried out in the regular way. In the shown case, the output characteristic of a pixel signal is shifted downward, resulting in shifting the level H above the boundary between the non-logarithmic response region WA and the logarithmic response region WB.

To avoid the above-described problem, according to the present invention, the level H is aligned with the boundary between the non-logarithmic response region WA and the logarithmic response region WB by conducting the offset compensation for variations in temperature characteristics of respective pixel signals before conducting the compensation of structure-derived variations in output characteristics of the same signals.

The same kind of problem may arise when conducting the compensation for variations in temperature characteristics of a pixel signal and then the compensation for structure-derived variations in output characteristics of the same signal. In this case, the level TH must be aligned with the boundary between the non-logarithmic response region WA and the logarithmic response region WB by conducting the offset compensation for the structure-derived variation in the output characteristics of the pixel signal before conducting the offset compensation for the variation in temperature characteristic of the same signal.

Figure 32:
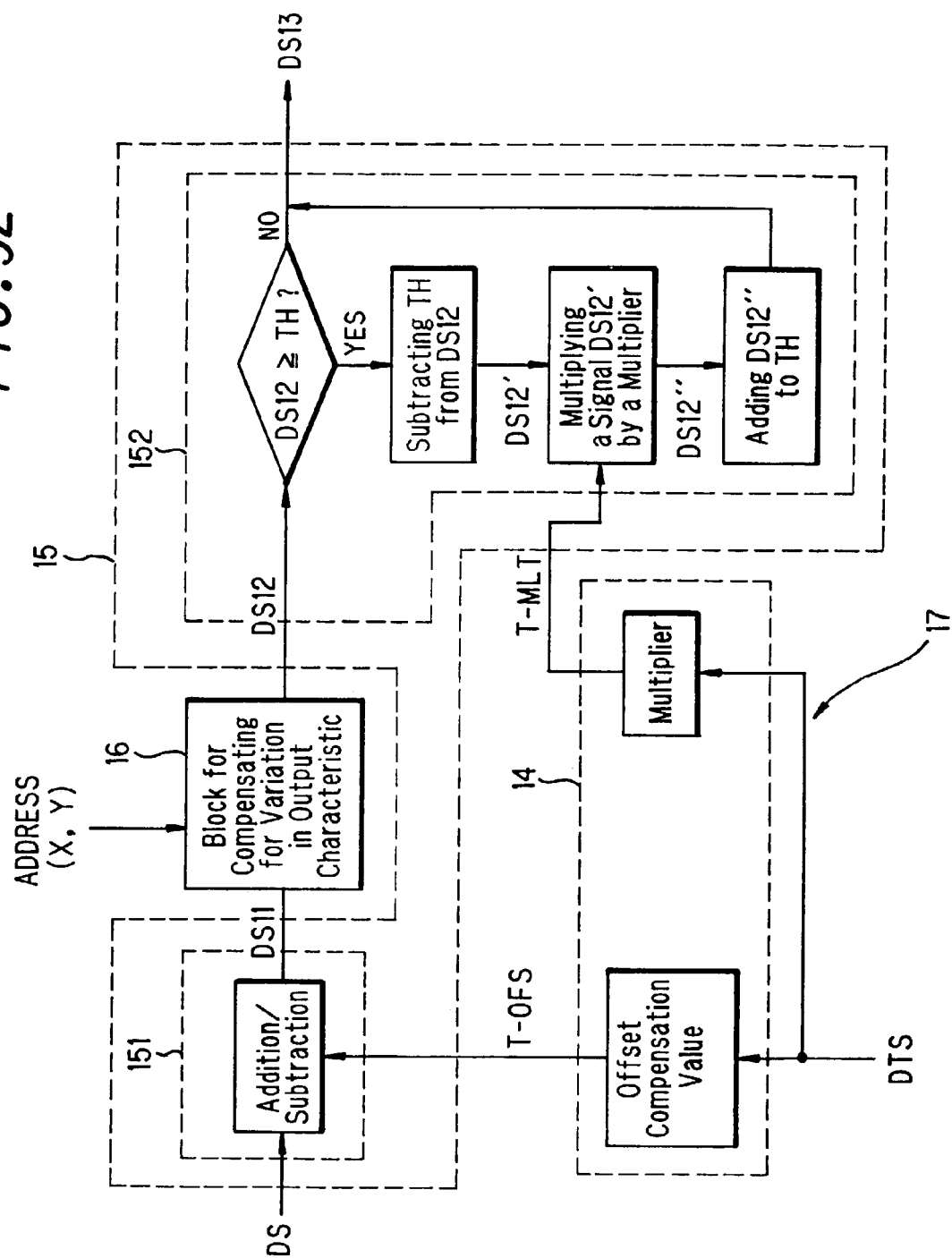
FIG. 32 shows another exemplary construction of an output compensating portion of an output compensating device according to the present invention.

FIG. 32 shows a procedure for conducting the offset-compensation of a pixel signal for a variation in its temperature characteristic, the offset and gain compensation for a structure-derived variation in its output characteristic and the gain compensation for a variation in its temperature characteristic in the described order. In FIG. 32, a block 16 is similar to the processing block 11 shown in FIG. 24 for performing the offset and gain compensation for a variation in the output characteristic of a pixel signal, and a block 17 is similar to the processing block 15 shown in FIG. 28 for performing the offset and gain compensation for a variation in the temperature characteristic of the pixel signal.

In this case, a pixel signal DS output from the image sensor 7 is digitized and transferred to an offset compensation block 151 on the side of the temperature characteristic compensation block 17, whereby the pixel signal is compensated for a variation in its temperature characteristic to attain a correct level H necessary for compensating for variation in the output characteristic of the pixel signal. The offset-compensated pixel signal DS11 is transferred to the processing block 16, whereby the signal is adaptively compensated for its output characteristic variation by the offset and gain compensations. The compensated pixel signal DS12 from the processing block 16 is then transferred to a gain compensating portion 152 on the side of processing block 17, whereby the signal is subjected to the gain compensation for its temperature characteristic variation. Finally, a pixel signal DS13 compensated for both kinds of characteristic variations is obtained.

Figure 33:
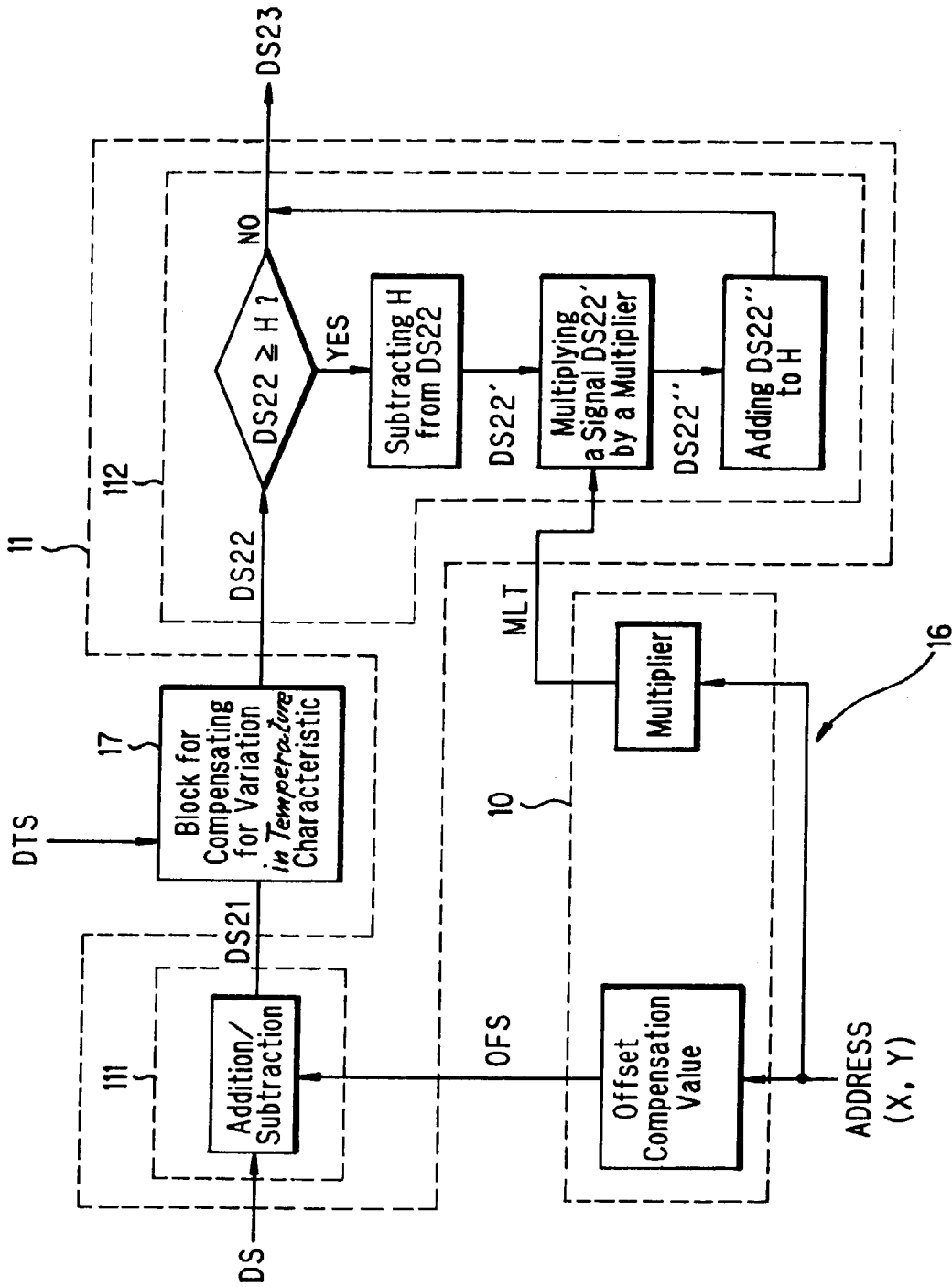
FIG. 33 shows another exemplary construction of an output compensating portion of an output compensating device according to the present invention.

FIG. 33 shows a procedure for conducting the offset compensation of a pixel signal for a structure-derived variation in its output characteristic, the offset and gain compensations for a variation in its temperature characteristic and then the gain compensations for variation in its output characteristic. In FIG. 33, a block 16 is similar to the processing block 11 shown in FIG. 24 for performing offset and gain compensation for a variation in the output characteristic of a pixel signal, and a block 17 is similar to the processing block 15 shown in FIG. 28 for performing the offset and gain compensations for a variation in the temperature characteristic of the same signal.

In this instance, a pixel signal DS from the image sensor 7 is digitized and transferred to an offset compensation block 111 on the side of the output characteristic compensating block 16, whereby the pixel signal is subjected to the offset compensation for a variation in its output characteristic to attain a correct level TH necessary for compensating a variation in the temperature characteristic of the same pixel signal. The offset-compensated pixel signal DS21 is transferred to the processing block 17, whereby it is adaptively processed by the offset and gain compensations for a variation in its temperature characteristic. The compensated pixel signal DS22 from the block 17 is transferred to a gain compensating block 112 on the side of the processing block 16, whereby the signal is further subjected to the gain compensation for a variation in its output characteristic. Finally, a pixel signal DS23 compensated for both kinds of characteristic variations is obtained.

Figure 35:
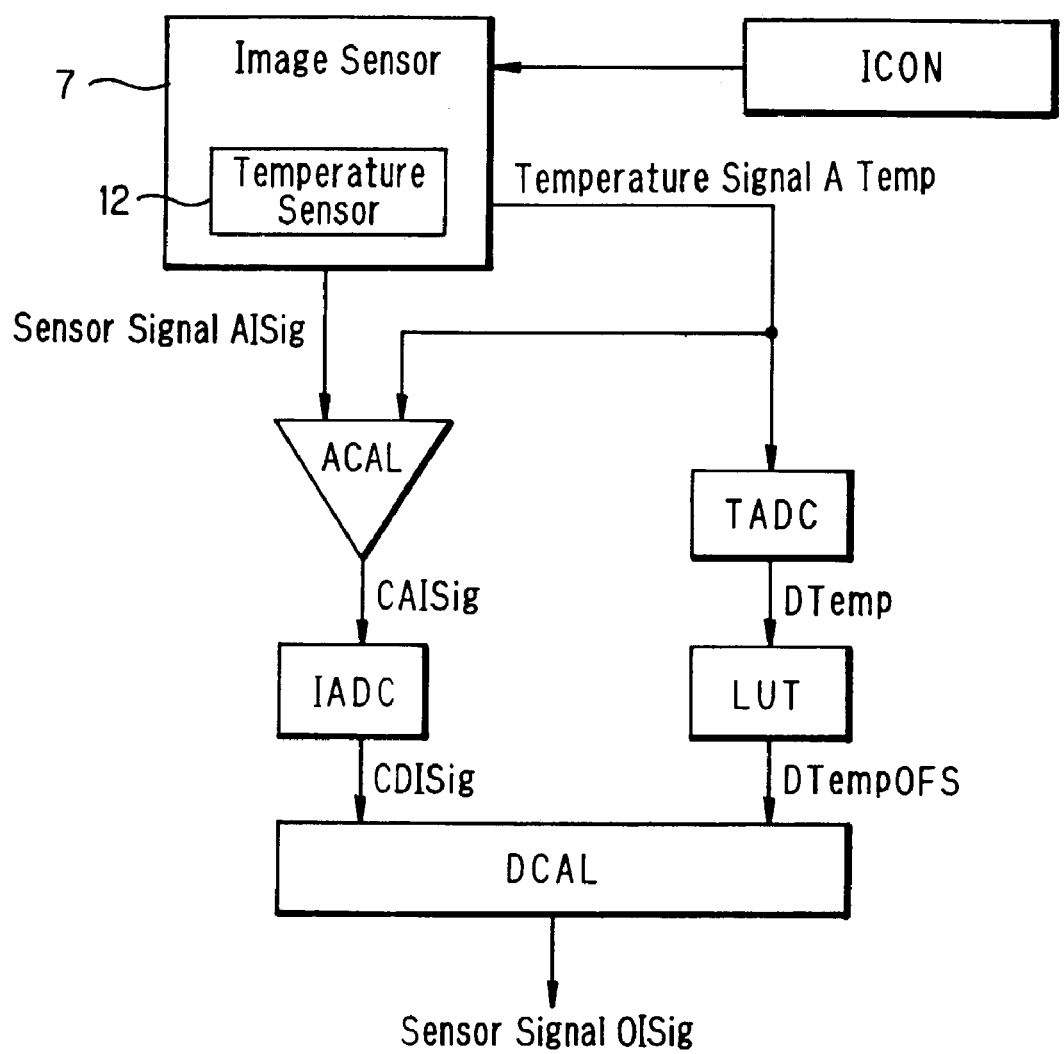
FIG. 35 is a block construction diagram of an output compensating device according to another embodiment of the present invention.

FIG. 35 shows an image sensor output compensating device according to another embodiment of the present invention.

This embodiment comprises an analog temperature compensating circuit ACAL for performing the temperature compensation of a sensor signal AlSig outputted under the control of the control circuit ICON from an image sensor 7 by analog calculating operations based on a temperature signal ATemp from a temperature sensor 12 provided in the image sensor 7, an A-D converter IADC for converting the temperature-compensated signal CAISig into a digital signal, an A-D converter TADC for converting the temperature signal ATemp received from the temperature sensor 12 into a digital signal, a lookup table LUT in which offset compensation values predetermined versus temperature values are stored and from which an offset compensation value is selected in accordance with a digital temperature signal DTemp supplied from the A-D converter TADC, and a digital temperature compensating circuit DCAL for performing the temperature compensation of the digital sensor signal CDISig using an offset compensation value Dtemp OFS read from the lookup table and outputting a temperature-compensated digital sensor signal OlSig.

The analog temperature compensating circuit ACAL carries out the arithmetic operation according to the equation: AlSig+α·Atemp, where a is a predetermined correction factor.

Figure 37:
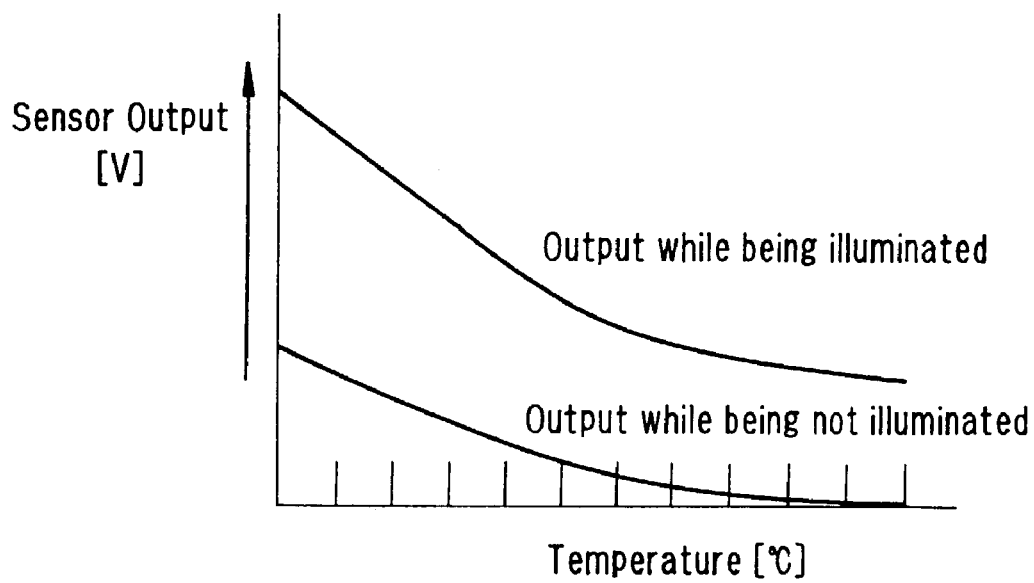
FIG. 37 is a graph showing output characteristics of a sensor signal from an image sensor, which varies as temperature of the sensor changes.

FIG. 37 shows the temperature characteristic of the temperature-compensated sensor signal AlSig processed by the analog temperature compensating circuit ACAL.

In the digital temperature compensating circuit DCAL, the specified offset compensation value DtempOFS is added to or subtracted from the digital sensor signal CDISig.

Figure 38:
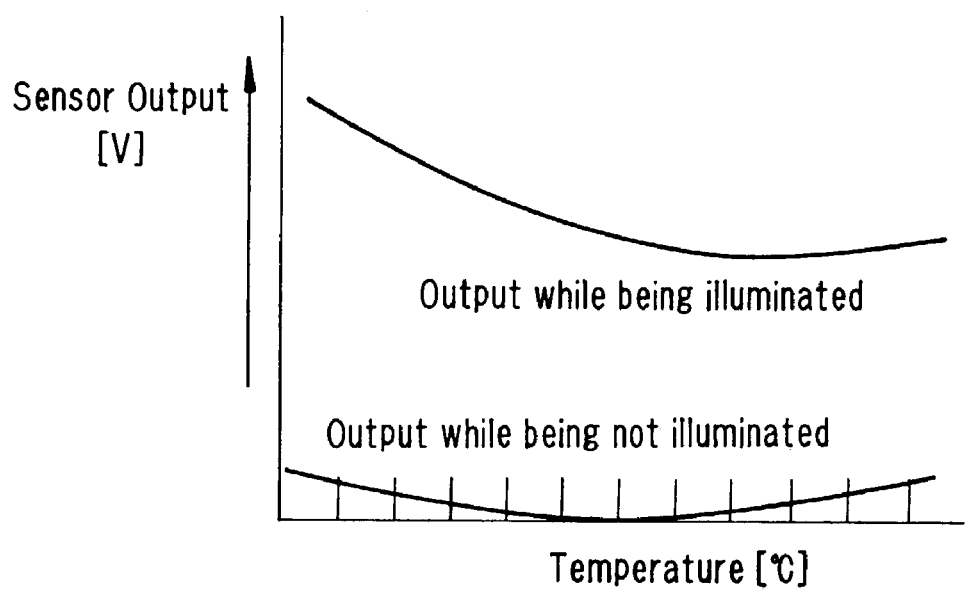
FIG. 38 shows a temperature-output characteristic of a pixel light sensor signal compensated for an offset by analog operations conducted by an output compensating device according to the present invention.

FIG. 38 shows the changing temperature characteristic of the analog temperature compensated sensor signal CAISig.

Figure 39:
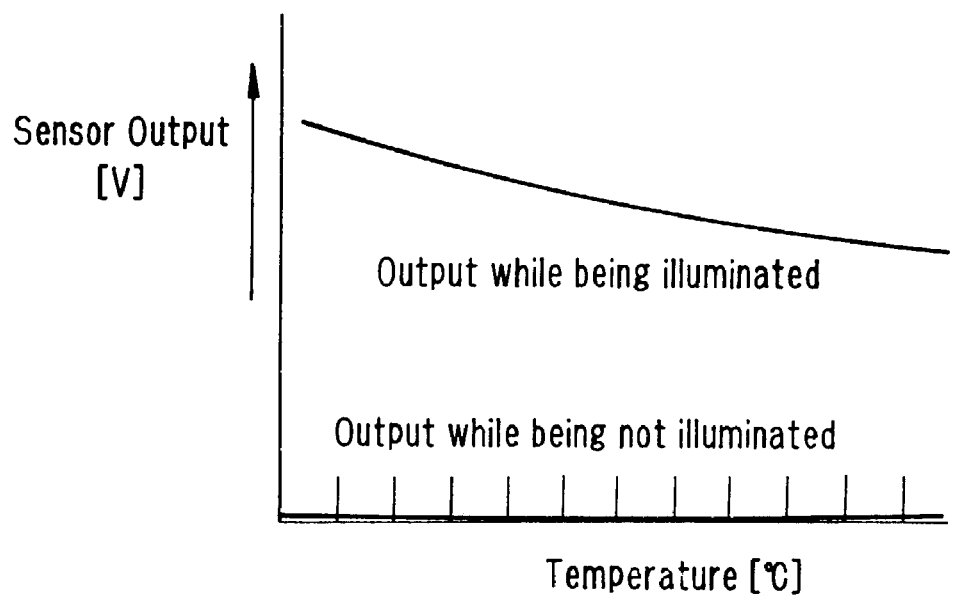
FIG. 39 shows a temperature-output characteristic of a sensor signal compensated for an offset by digital operations conducted by an output compensating device according to the present invention.

FIG. 39 shows the temperature characteristic of the offset-compensated sensor signal OlSig processed by the digital temperature compensating circuit DCAL.

According to the present invention, the sensor signal AlSig is subjected to temperature compensation by analog operations to produce the temperature-compensated signal CAlsig with a least variation, which is then converted into digital signal by the A-D converter IADC that can, therefore, operate with an input range preset to a useful narrow range. According to the present invention, the digitized sensor signal can be further compensated for variation in a non-liner portion of its temperature characteristic by the digital operations, which variation could not be corrected by the preceding analog operations. Thus, the sensor signal AlSig output from the image sensor 7 can be correctly compensated for variation in its temperature characteristic.

Figure 36:
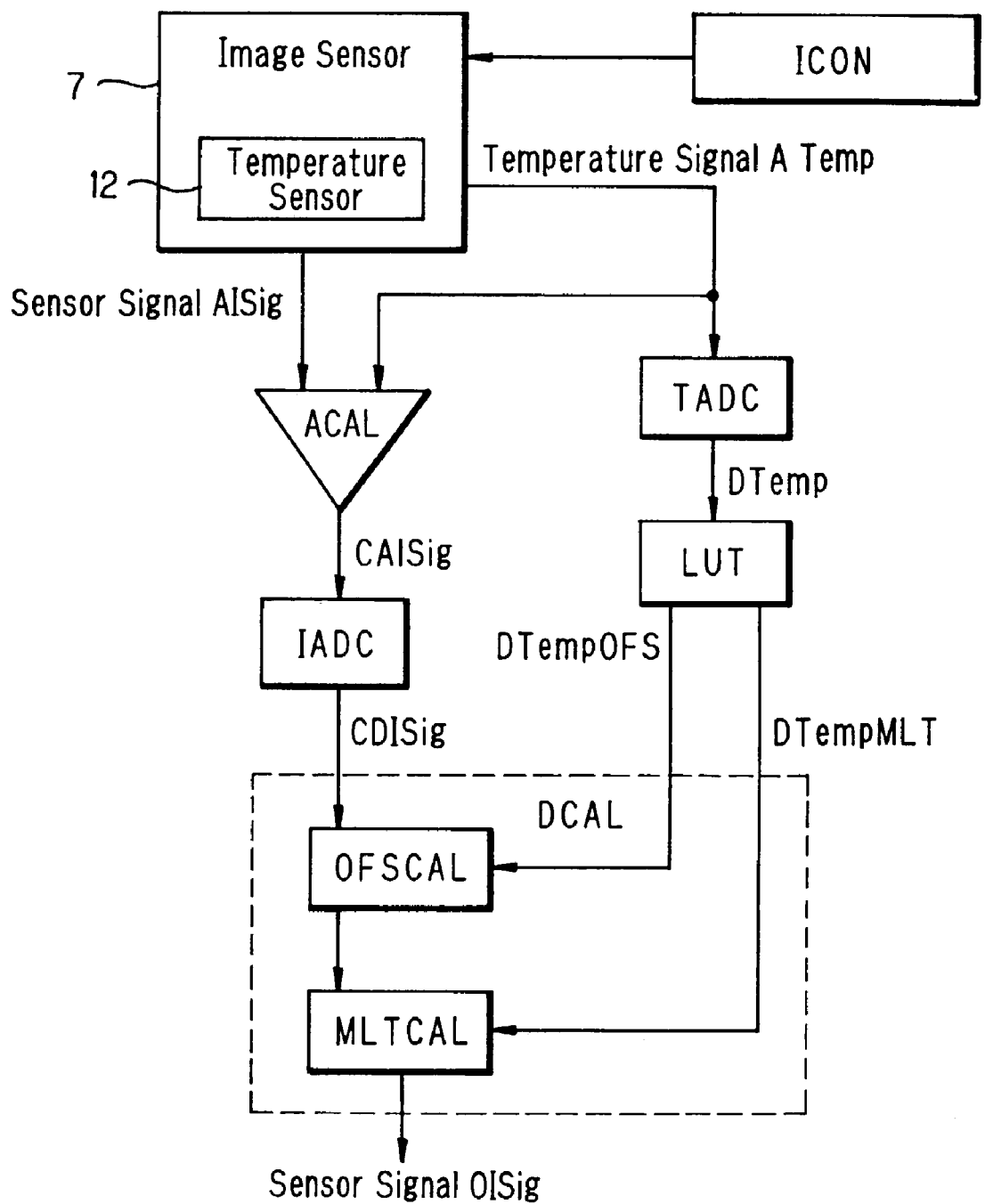
FIG. 36 is a block construction diagram of an output compensating device according to another embodiment of the present invention.

FIG. 36 shows an image sensor output compensating device according to still another embodiment of the present invention.

In this embodiment, a lookup table LUT contains offset-compensation values predetermined versus temperatures and gain compensation multipliers. A specified offset-compensation value DtempOFS and a specified gain-compensation multiplier DtempMLT corresponding to a digital temperature signal Dtemp are taken from the lookup table and transferred to the digital temperature compensating circuit DCAL wherein the offset-compensation and gain-compensation of a sensor signal CDISig are conducted subsequently by an offset compensation calculating portion OFSCAL and a gain compensation calculating portion MLTCAL respectively.

Figure 40:
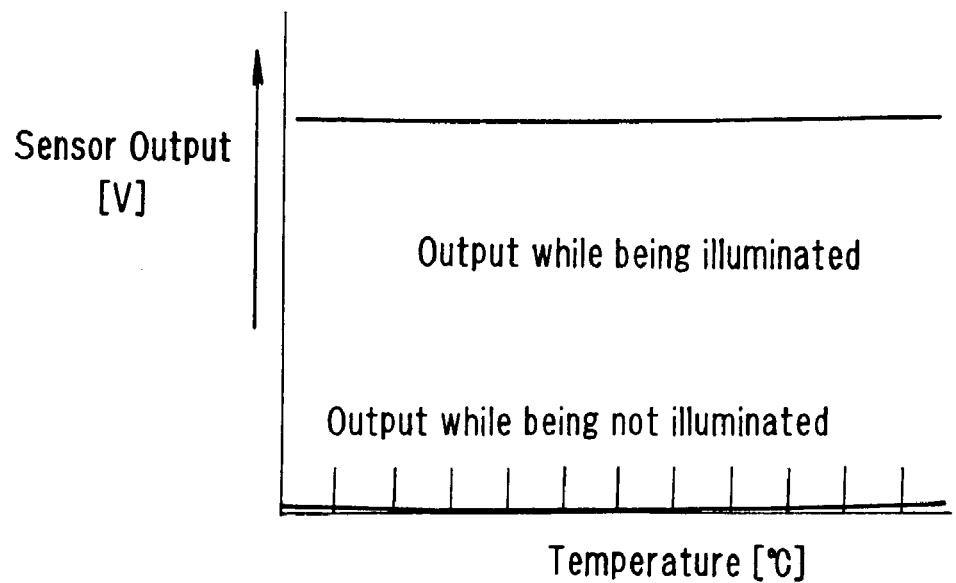
FIG. 40 shows a temperature-output characteristic of a sensor signal obtained by offset compensation and gain compensation by digital operations conducted by an output compensating device according to the present invention.
Figure 41:
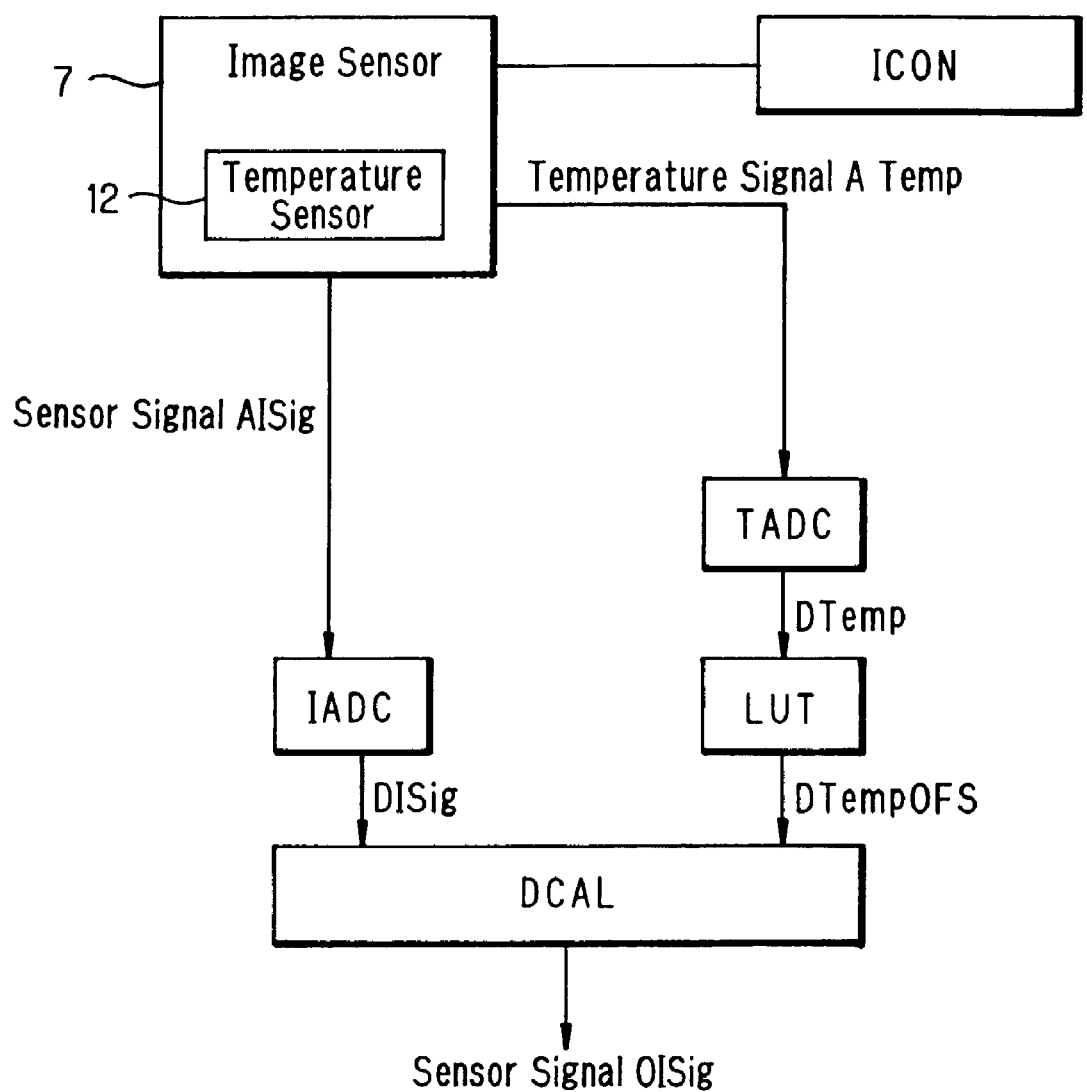
FIG. 41 is a block diagram of a conventional image sensor output compensating device.

FIG. 40 shows the temperature characteristic of the sensor signal OlSig processed by the digital temperature compensating circuit DCAL of FIG. 36.

Figure 42:
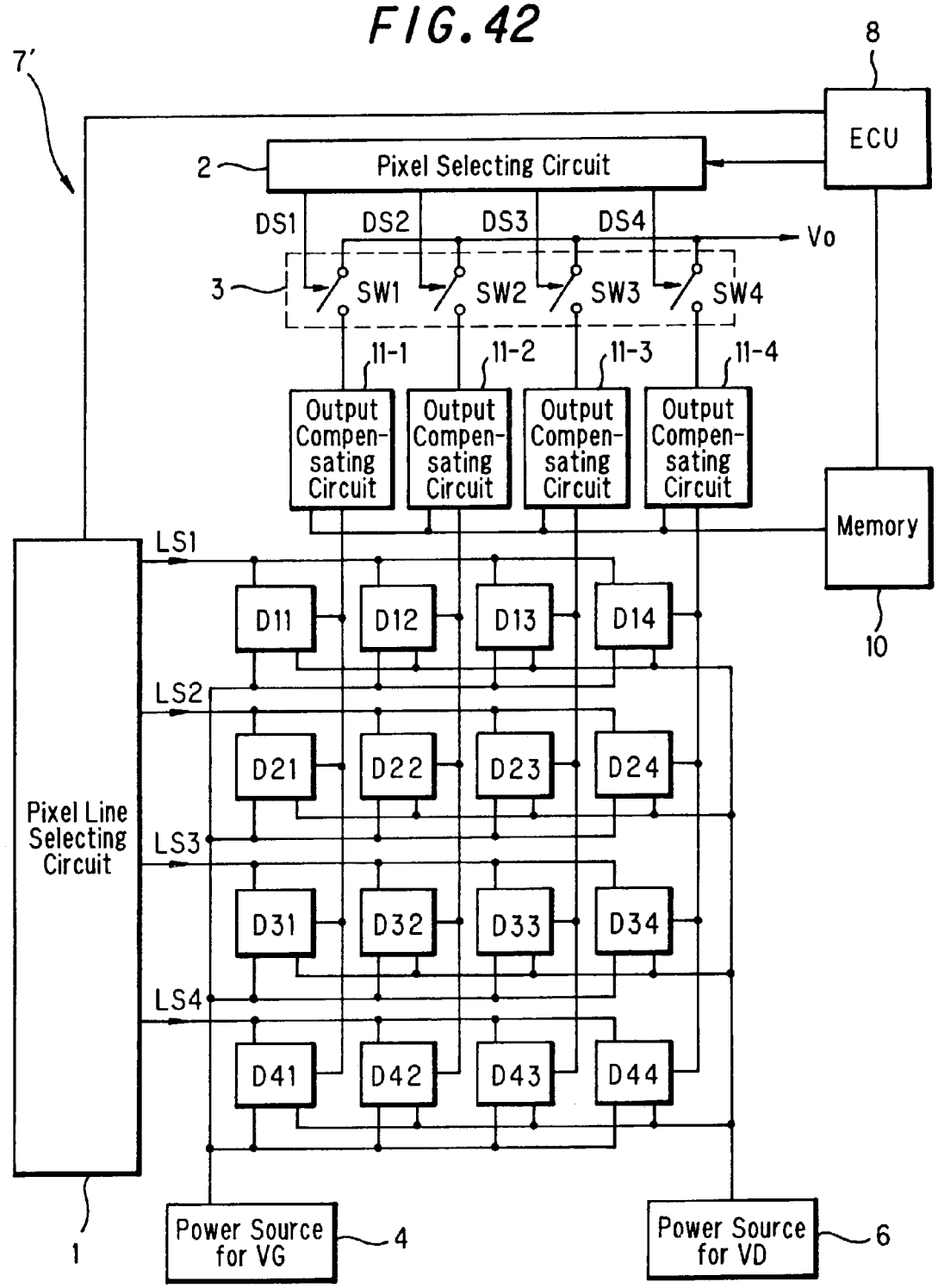
FIG. 42 is a basic block diagram of an image sensor with another output compensating device.

FIG. 42 shows an image sensor output compensating device according to another embodiment of the present invention. In this embodiment, four output compensating circuits 11-1, 11-2, 11-3 and 11-4 are provided for respective signal lines for reading signals Vo from respective lines of pixels in the image sensor body 7' in contrast to the embodiment of FIGS. 9 and 11 having a single output-compensating circuit 11 disposed on the output side of an image sensor body 7 for outputting pixel signals Vo sequentially in a time series. In this embodiment, the image sensor body 7' is not provided with a voltage changing-over circuit 5 that is provided in the image sensor of FIG. 9 for initializing pixel circuits. A memory 10 is an analog memory and the analog output compensating circuits 11-1~11-4 use analog calculating circuits. To use a digital memory as the memory 10 and digital calculating circuits as the output compensating circuits 11-1~11-4, an A-D converter must be provided on the input side of each of the circuits 11-1~114.

According to the present invention, an image sensor body including a matrix of pixel circuits is mounted together with peripheral circuits for compensating for variations in the output characteristics of the pixel signals on a silicon chip to form a single compact device.

Figure 43:
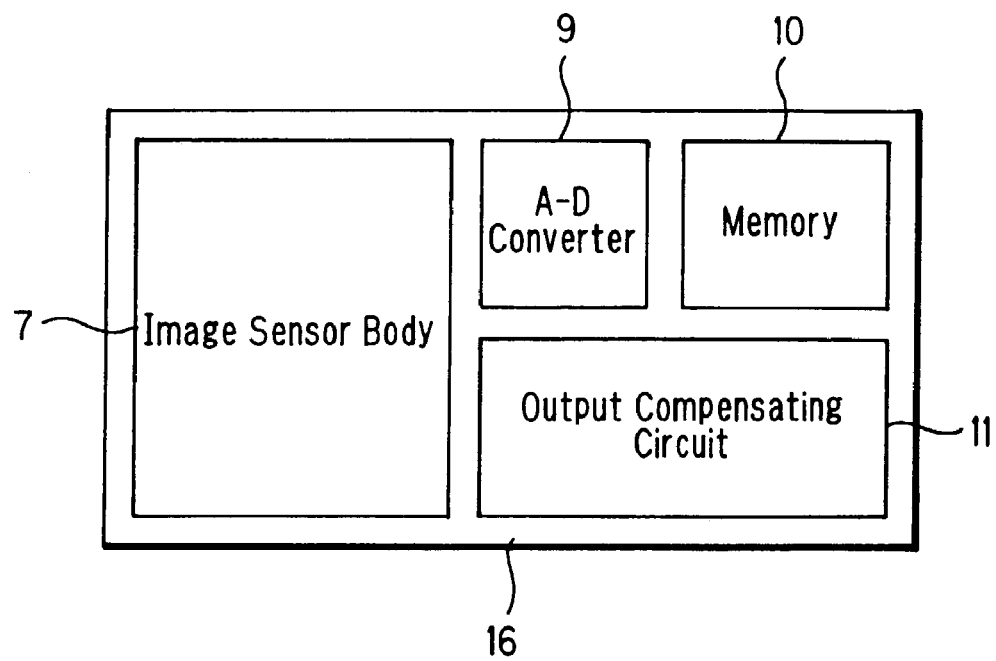
FIG. 43 is schematic view of an image sensor body, an A-D converter, a memory and an output compensating circuit, which are all assembled on a single silicon chip.
Figure 44:
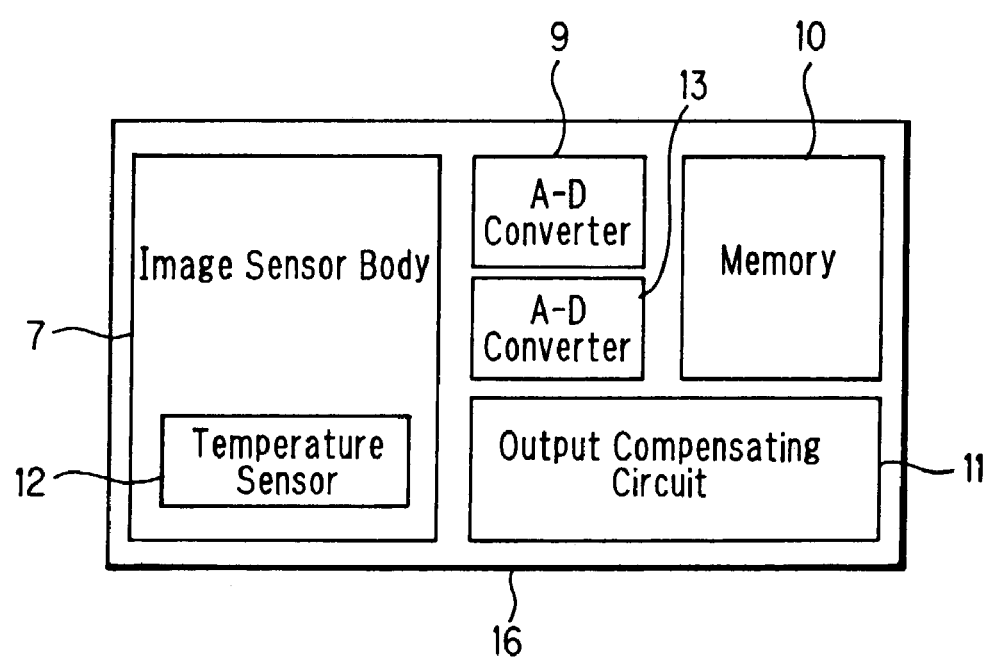
FIG. 44 is schematic view of an image sensor body with a temperature sensor incorporated therein, an A-D converter, another A-D converter, a memory and an output compensating circuit, which are all assembled on a single silicon chip.
Figure 45:
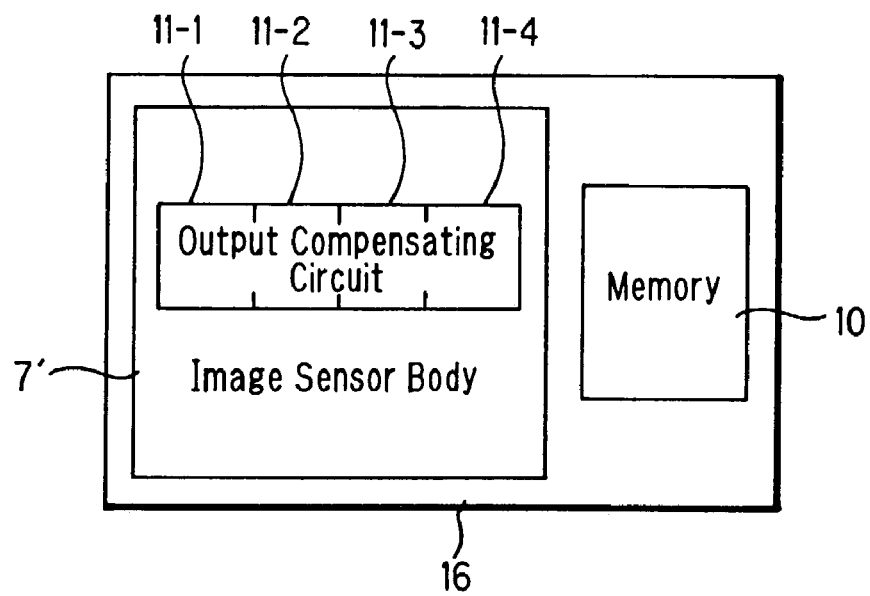
FIG. 45 is schematic view of an image sensor body incorporating an output compensating circuit shown in FIG. 42 and a memory, which are all assembled on a single silicon chip.

In practice, as shown in FIG. 43, an image sensor body 7 having the construction shown in FIG. 11, an A-D converter 9, a memory 10 and an output compensating circuit 11 are assembled on a silicon chip 16. It is also possible to mount an image sensor body 7 with a temperature sensor 12 incorporated therein as shown in FIG. 16, an A-D converter 9, an A-D converter 13, a memory 14 and an output compensating circuit 11 on a silicon chip 16 as shown in FIG. 44. It is further possible to mount an image sensor body 7 incorporating output compensating circuits 11-1-1~1-14 of FIG. 42 and a memory 10 on a silicon chip 16 as shown in FIG. 42.

In the above-described examples, the image sensor body and the peripheral circuits for compensating for variations in output characteristics of pixel circuits are mounted on the same surface of a silicon chip to form a single compact device. It is also possible to mount the image sensor body on one surface of a silicon chip and the peripheral circuits on the reverse surface of the same silicon chip. This makes it possible to use a chip of a smaller size.

In place of a silicone chip, a circuit board may be used for mounting thereon an image sensor body together with peripheral circuits for compensating variations in output characteristics of pixel circuits.

Figure 46:
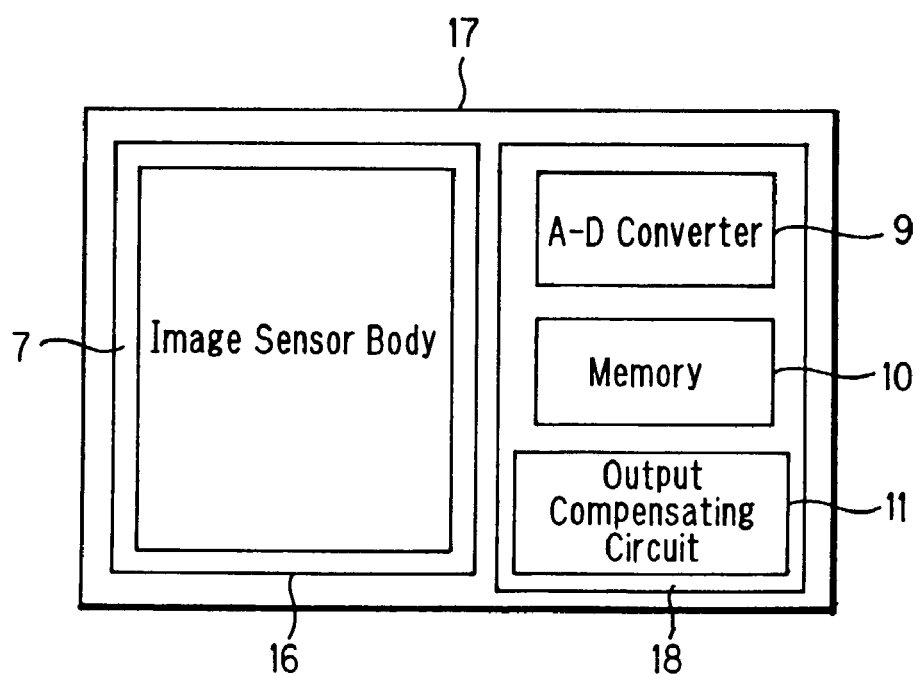
FIG. 46 is schematic view of an exemplary package of an image sensor in which an A-D converter, a memory and an output compensating circuit are mounted together with a silicon chip of an image sensor body.

As shown in FIG. 46, peripheral circuits (A-D converter 9, a memory 10 and an output compensating circuit 11) are integrally mounted in a package 17 with a chip-mounted image sensor body 7 incorporated therein. In this instance, a circuit board 18 on which the A-D converter 9, the memory 10 and the output compensating circuit 11 have been integrally formed is mounted in the package 17. The circuit board 18 may be arranged parallel with or laid on the silicon chip 16 in the package 17.

Figure 47:
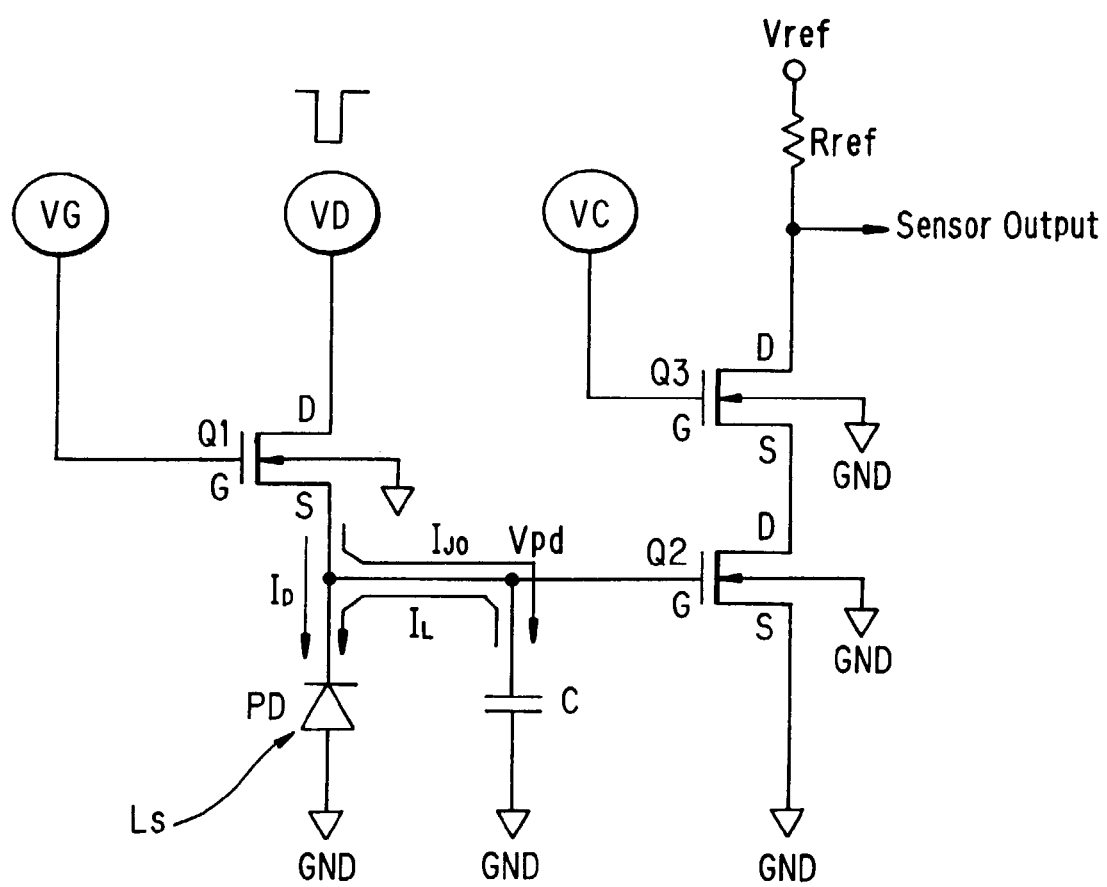
FIG. 47 is another exemplified circuit diagram of a light sensor circuit representing a unit pixel in an image sensor.
Figure 48:
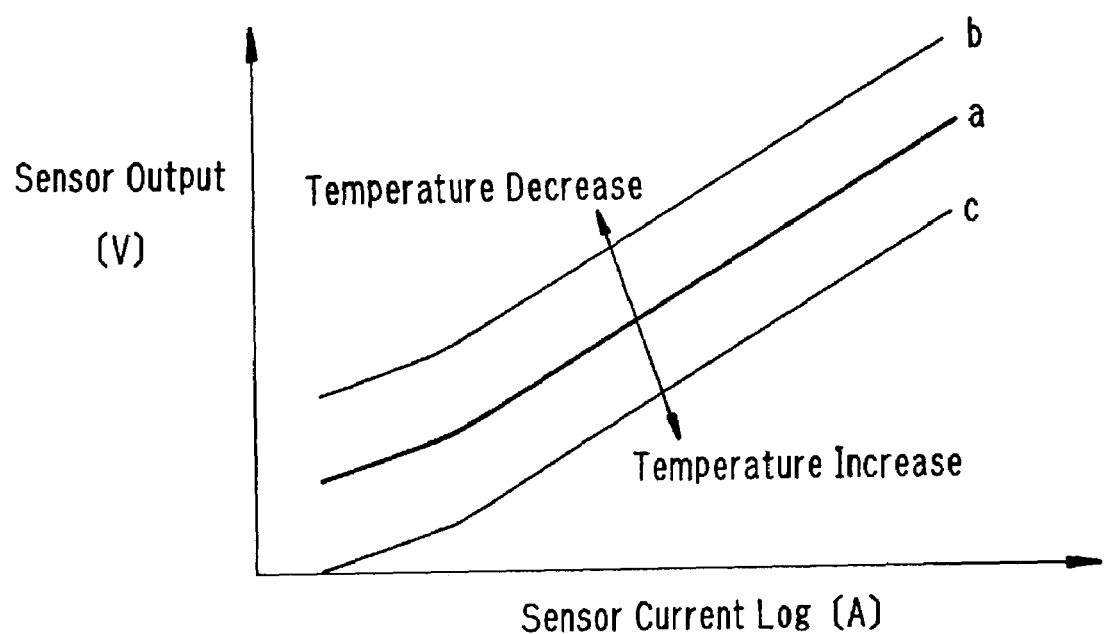
FIG. 48 shows output characteristics of a sensor signal output from an image sensor when the temperature of the sensor changes.

FIG. 47 shows an exemplary construction of a light sensor circuit representing a unit pixel, which is used in an image sensor. In this example, there is provided an output circuit for outputting a sensor signal as a voltage value produced by applying through a reference resistance Rref a bias voltage Vref to the output side of a transistor Q3 in the light sensor circuit The light sensor circuit has an output characteristic changing with temperature as shown in FIG. 48. The characteristic curve (a) of the circuit can be observed at the standard temperature. When the temperature is lower than the standard temperature, the output characteristic of the circuit may vary upward as shown by the characteristic curve (b). When the temperature is higher than the standard, the output characteristic of the circuit may vary downward as shown by the characteristic curve (c).

Therefore, the image sensor having a number of the light sensor circuits arranged to form a matrix of pixels requires the temperature compensation of each of the light sensor signals sequentially output from respective light sensor circuits by offsetting a variation from the standard value, which variation may be caused by the effect of the ambient temperature of the image sensor.

According to the present invention, a bias voltage regulating means is provided for regulating a variable bias voltage Vref provided in the output circuit of the light sensor circuits in accordance with a temperature signal supplied from a temperature sensor of the image sensor so that the light sensor signal is suitably offset to compensate for the variation from the standard output characteristic.

Figure 49:
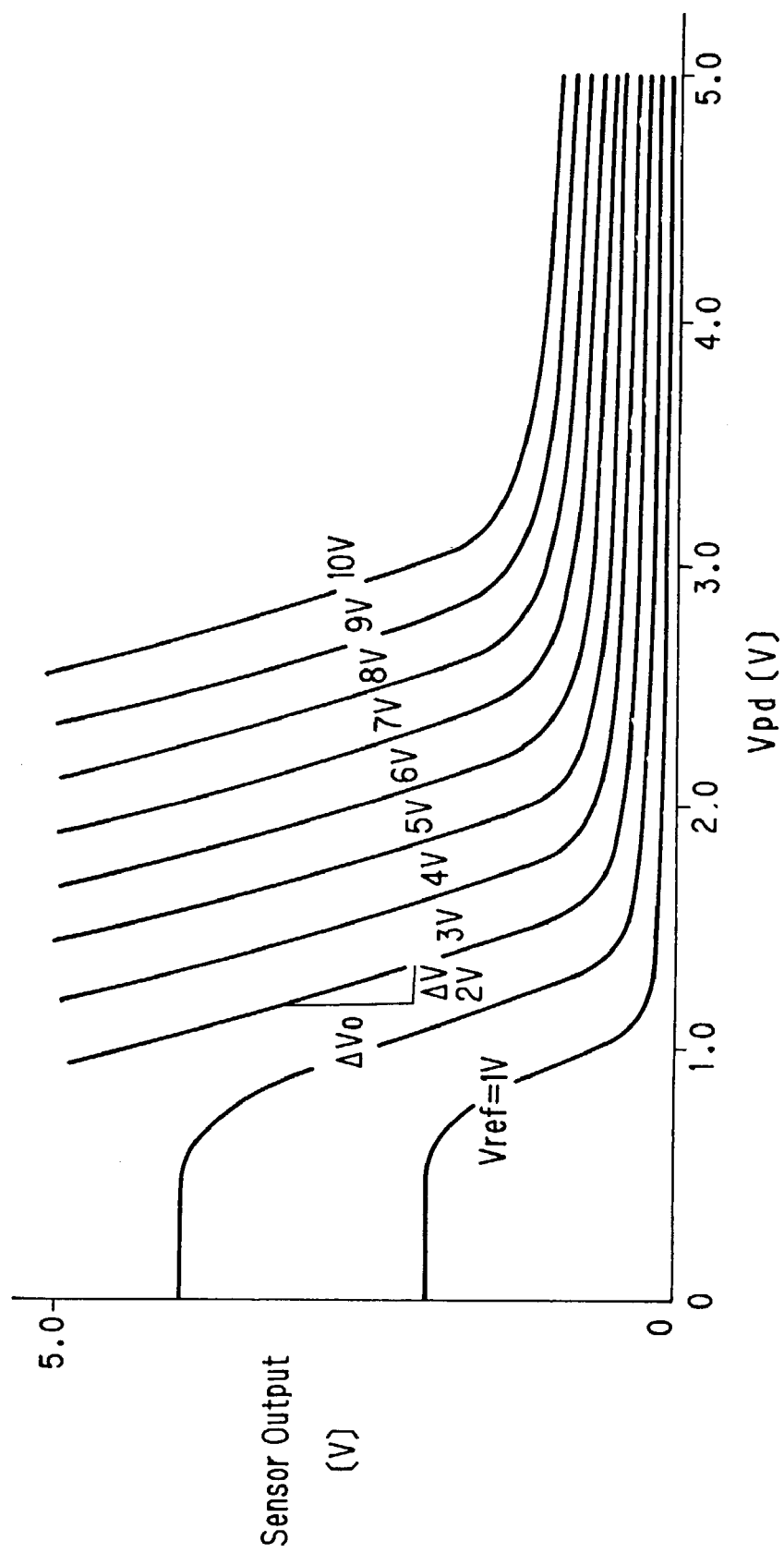
FIG. 49 shows output characteristics of a light sensor versus a terminal voltage of a photodiode when using bias voltage as a parameter for outputting of the sensor signal.

FIG. 49 shows the voltage Vpd versus output characteristics of a light sensor circuit when changing the bias voltage Vref in a range from 1 to 10V.

The diagram indicates that a change D Vo in output of the sensor with the voltage Vpd having been changed by a value D V is constant and hence the temperature-derived variation in the output of the sensor can be cancelled by changing the bias voltage Vref.

Figure 50:
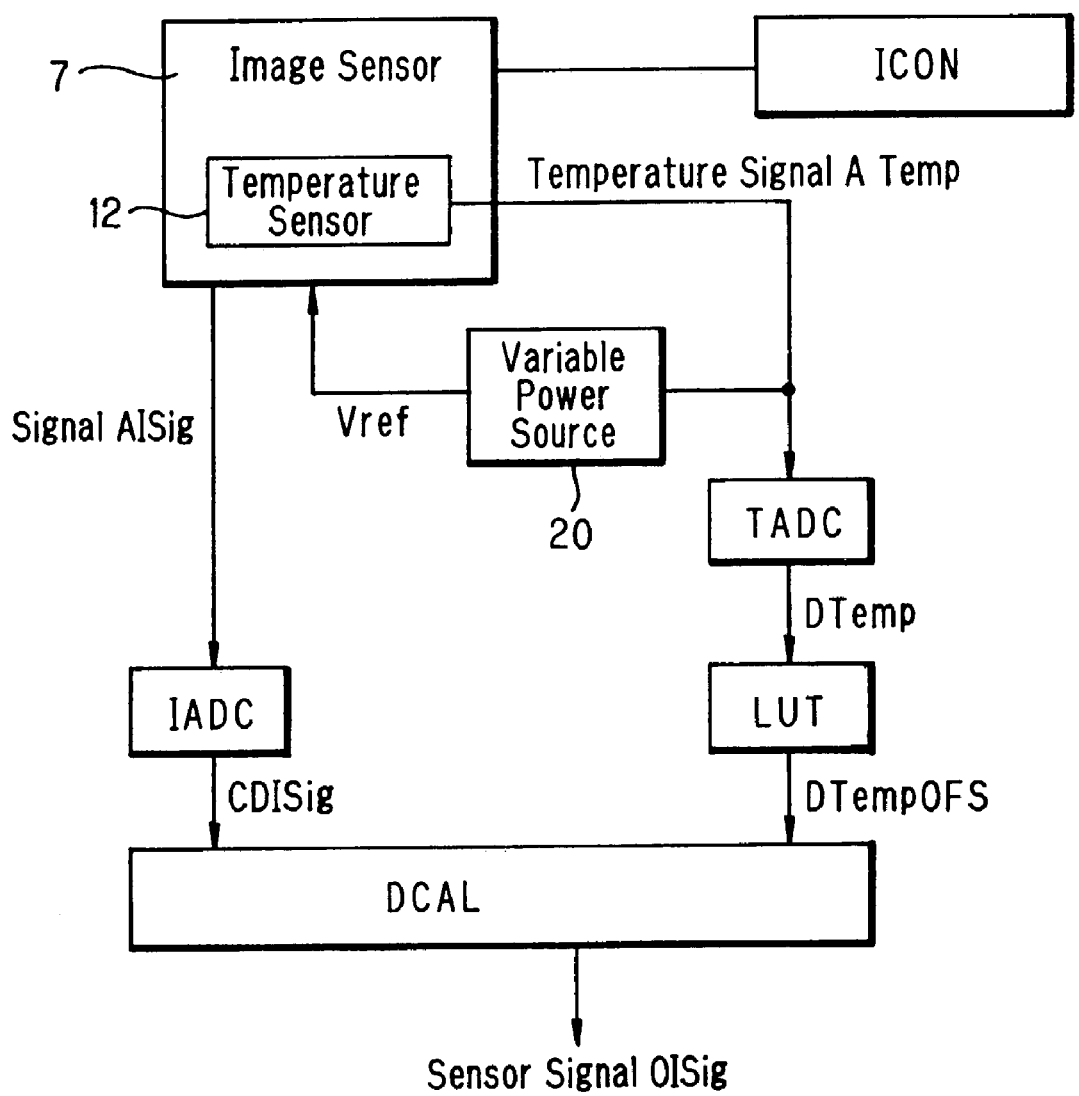
FIG. 50 is a block diagram of an image sensor output compensating device according to another embodiment of the present invention.

FIG. 50 shows an output compensating device for an image sensor according to another embodiment of the present invention. In this embodiment, a temperature sensor 12 detects an ambient temperature of an image sensor body 7 and transfers a temperature detection signal ATemp to a variable power source 20 that in turn regulates the bias voltage Vref in the output circuit of the image sensor in accordance with the detected temperature. Namely, when the detected temperature of the image sensor 7 differs from the standard value, the variable power source 20 changes the voltage value in accordance with the detected temperature to offset the variation in the output of the sensor. A bias voltage Vref at a specified voltage value corresponding to the temperature detection signal ATemp can be thus supplied to the image sensor 7. This embodiment comprises an A-D converter IADC for receiving pixel-sensor signals AlSig output in a time series from the image sensor 7 under the control of a control unit ICON and converting the received signals into digital signals, an A-D converter TADC for converting a temperature detection signal Atemp received from the temperature sensor 12 into a digital signal, a lookup table LUT of offset compensation values DTempOFS to be taken therefrom using the digitized temperature signal DTemp to identify the required value, and a digital temperature compensating circuit DCAL for performing the temperature compensation of the digitized sensor signal CDISig by using the retrieved offset compensation value DTempOFS and outputting a digital temperature-compensated sensor signal OlSig.

Figure 51:
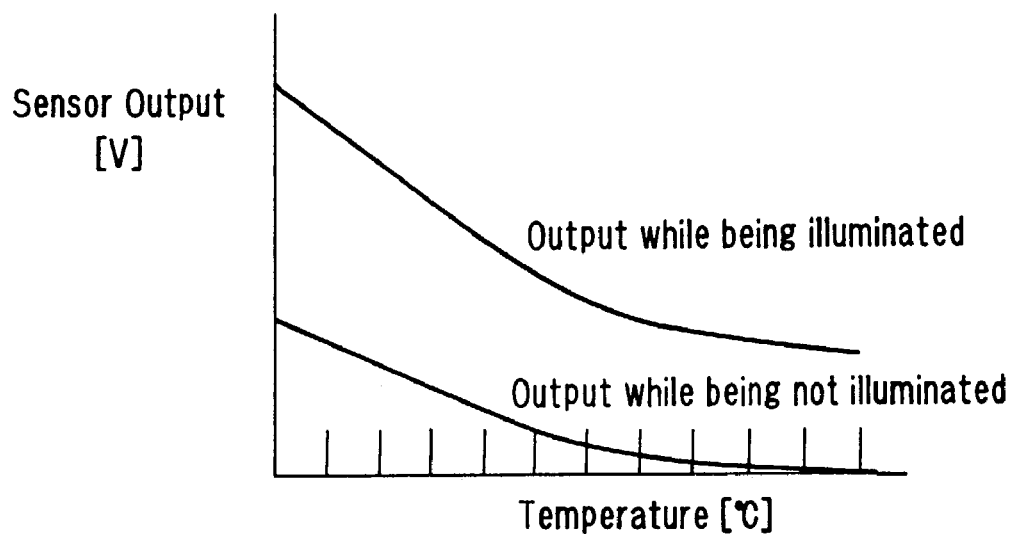
FIG. 51 shows characteristics of a sensor signal output from an image sensor.

FIG. 51 shows the temperature characteristics of a sensor signal AlSig output from the image sensor 7.

In the digital temperature compensating circuit DCAL, the specified offset-compensation value DTempOFS is added to or subtracted from the digital sensor signal CDISig.

Figure 52:
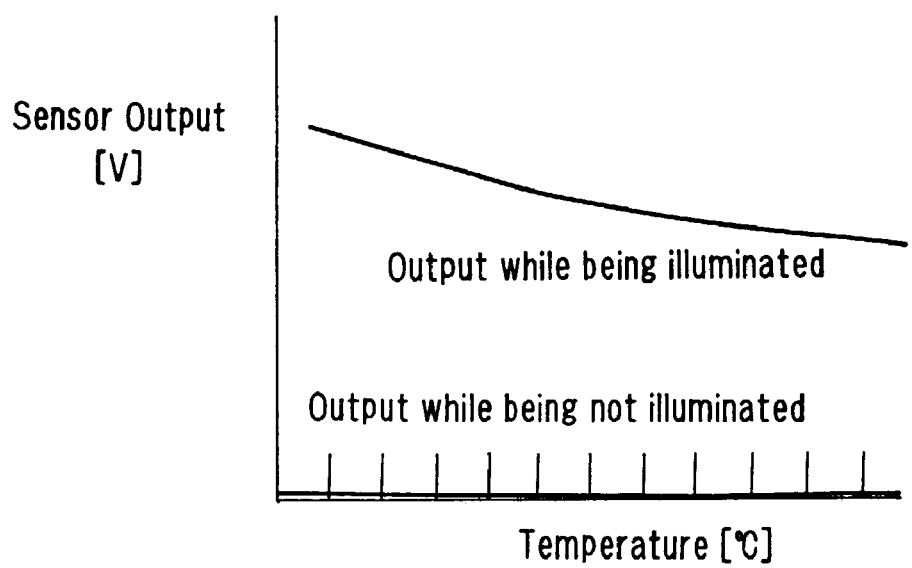
FIG. 52 shows temperature characteristics of a sensor signal compensated for temperature by digital operations of an output compensating device according to the present invention.

FIG. 52 shows the temperature characteristic of the offset-compensated sensor signal OlSig processed by the digital temperature compensating circuit DCAL.

According to the present invention, the sensor signal AlSig is compensated for its temperature characteristic variation first by regulating a bias voltage Vref in the output circuit of the image sensor 1 in accord with the temperature detection signal ATemp from the temperature sensor 12 to produce the temperature-compensated signal (AlSig) that is then converted into digital signal by the A-D converter IADC that can, therefore, operate with an input range preset to a useful narrow range.

According to the present invention, the digitized sensor signal can be further compensated for variation in a non-liner portion of its temperature characteristic by the digital operations, which variation could not be corrected by the preceding regulation of the bias voltage (Vref). Thus, the sensor signal AlSig output from the image sensor 7 can be correctly compensated for variation in its temperature characteristic.

Figure 53:
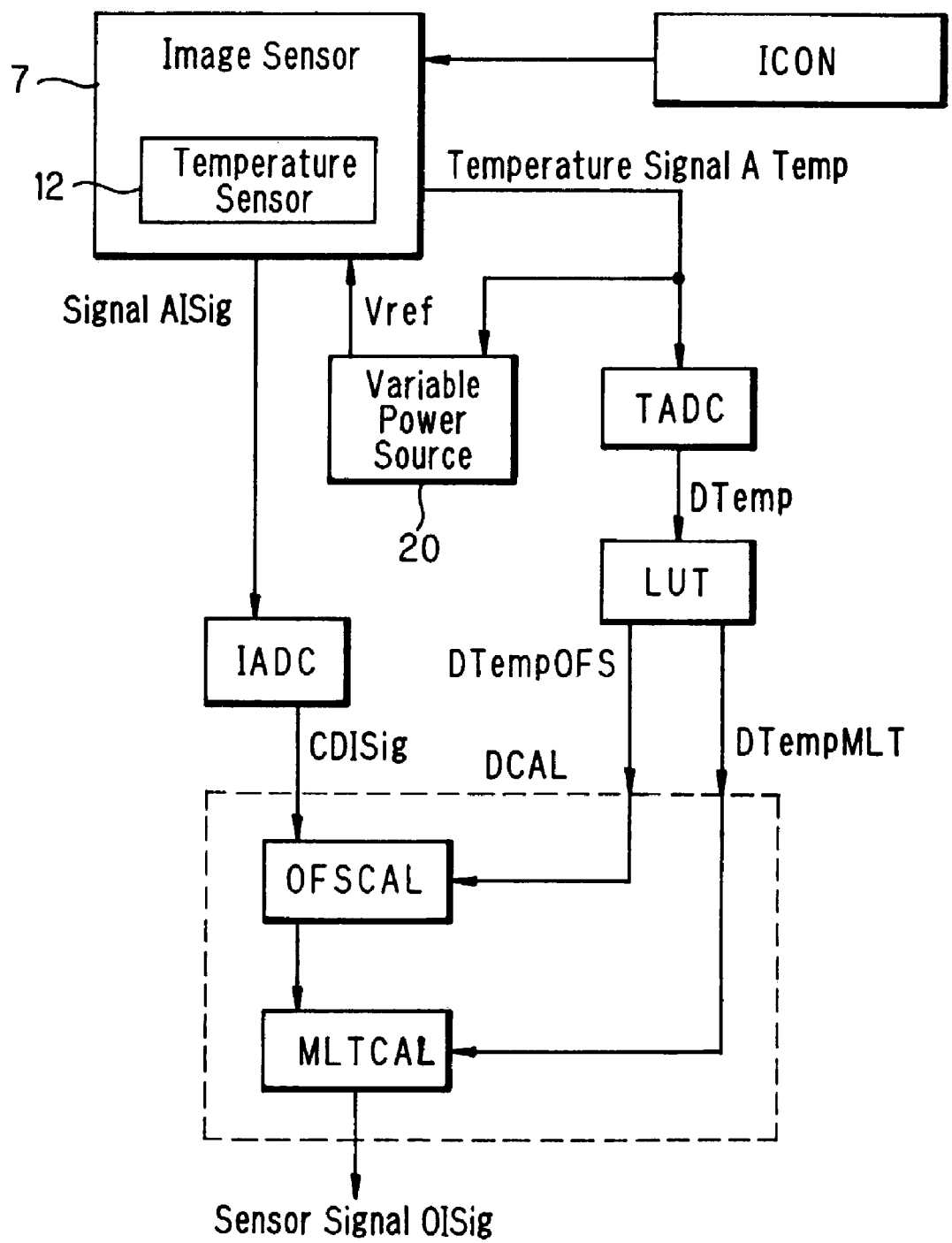
FIG. 53 is a block diagram of an output compensating device according to another embodiment of the present invention.

FIG. 53 shows an output compensating device for an image sensor according to another embodiment of the present invention. In this embodiment, a lookup table LUT contains offset-compensation values predetermined versus temperatures and gain compensation multipliers.

Figure 54:
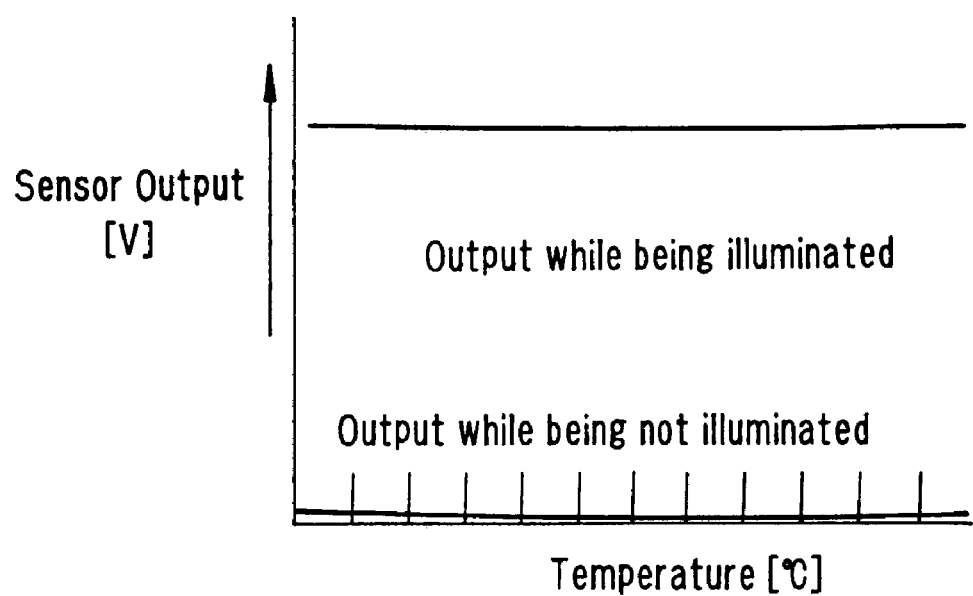
FIG. 54 shows temperature characteristics of a sensor signal compensated by offset compensation and gain compensation by digital operations of an output compensating device according to the present invention.

A specified offset-compensation value DTempOFS and a specified gain-compensation multiplier DTempMLT corresponding to a digital temperature signal DTemp are taken from the lookup table and transferred to the digital temperature compensating circuit DCAL wherein the offset and gain compensations of a sensor signal CDISig are conducted subsequently by an offset compensation calculating portion OFSCAL and a gain compensation calculating portion MLT-CAL respectively. FIG. 54 shows the temperature characteristic of the sensor signal OlSig processed by the digital temperature compensating circuit DCAL.

As the result of the offset and gain compensation by the digital temperature-compensating circuit DCAL, the sensor signal CDISig attains a flat characteristic shown in FIG. 54 in contrast to the preliminarily offset compensated signal having a gradient output characteristic as shown in FIG. 52 while the sensor is illuminated.

Industrial Applicability of the Invention

In an image sensor composed of a number of light sensor circuits, each of which represents a unit pixel and can produce a sensor signal having a logarithmic response characteristic with a large quantity of incident light and a sensor signal having a non-logarithmic response characteristic with a small quantity of incident light, an output compensating device according to an aspect of the present invention is capable of optimally correcting pixel signals from the image sensor in such a manner that each of the pixel signals composing an output image of the image sensor is subjected first to the offset compensation and output, if the offset compensated signal has a characteristic within a logarithmic or non-logarithmic response region, or further processed by the gain compensation, if the offset compensated signal has a characteristic within a non-logarithmic or logarithmic response region, and then output. In this case, the pixel signals can be adaptively corrected in accord with the output conditions to attain uniform characteristics being free from the effect of structure-derived variations in output characteristics and variations in temperature characteristics of respective pixel sensor circuits.

According to another aspect of the present invention, there is provided an image sensor output compensating device which can suitably correct every pixel signal output from the image sensor with no effect of variations in temperature characteristics of respective light sensor circuits since each pixel signal is corrected first by offset compensation for its temperature characteristic variation, second by the offset and gain compensations for its output characteristic variation and finally by the gain compensation for its output characteristic variation.

An image sensor output compensating device according to another aspect of the present invention can suitably correct every pixel signal output from the image sensor with no effect of structure-derived variations in output characteristics of respective light sensor circuits since each pixel signal is corrected first by offset compensation for structure-derived variation in its output characteristic, second by the offset and gain compensations for its temperature characteristic variation and finally by the gain compensation for its output characteristic variation.

An image sensor output compensating device according to another embodiment of the present invention is capable of correcting every sensor signal having an output characteristic varying with a change in temperature of the sensor body by a digital processing method in such a manner that the temperature compensation of each output signal from each of the light sensor circuits composing the image sensor is conducted first by analog arithmetic calculations and then the temperature-compensated analog signal is converted by an A-D converter with an input range preset to a narrow band into a digital signal that is then corrected for a non-linear portion of its temperature characteristic which variation could not be eliminated by the preceding analog correction method. An accurate digital compensation of the image sensor output by effectively using an input range of the A-D converter can be thus achieved.

In an image sensor composed of a number of light sensor circuits arranged to form a matrix of pixels, each of which represents a unit pixel and can produce in a photoelectric converting element a sensor current proportional to the quantity of light falling thereon and converting the sensor current into a voltage signal by using a MOS type transistor with a logarithmic output characteristic in a weak inverse state, an output compensating device according to a further aspect of the present invention can obtain the high quality pixel signals free from the effect of variations in output characteristics since each pixel signal is corrected by using a means provided for reading the necessary compensation value from a memory storing therein the offset compensation values corresponding to variations in the characteristics of the respective pixel sensor circuits and performing the arithmetic operations necessary for compensation of the signal with the readout value.

An image sensor output compensating device according to another aspect of the present invention can be formed as an integral part of the image sensor to form a compact single unit in such a manner that an image sensor body for reading outputs of light sensor circuits forming a matrix of pixels, a memory and a peripheral circuit for compensating for variations in output of respective pixel circuits are assembled all on a single chip or substrate or an output compensating device comprising the memory and the operational circuit is mounted in a single compact package in which a chip with the image sensor body is disposed.

An image sensor output compensating device according to another aspect of the present invention is capable of compensating each of the sensor signals from the image sensor for temperature-output variation, without doing calculating operations by any compensational calculation circuit, in such a manner that a bias voltage through a reference resistance is applied to an output side of each of MOS-type light-sensor circuits and is adjusted by an adjusting means in accordance with a detection signal from a temperature sensor of the image sensor to compensate for the output pixel signal for a variation caused by a change in temperature.

An image sensor output compensating device according to another aspect of the present invention is capable of correcting every sensor signal having an output characteristic varying with a change in temperature of the sensor body by a digital processing method in such a manner that each output signal from each of the light sensor circuits composing the image sensor is first corrected by analog arithmetic calculations and then converted by an A-D converter with an input range preset to a narrow band into a digital signal that is then corrected by the digital method for any variation in a non-linear portion of temperature characteristic, which variation could not be eliminated by the preceding analog correction method. An accurate temperature compensation of the image sensor output by the digital method effectively using an input range of the A-D converter can be thus achieved.

What is claimed is:

1. An output compensating device for an image sensor capable of reading pixel signals from each of MOS type light-sensor circuits each provided at its output side with a variable bias voltage applied thereto through a reference resistance, which has a means for adjusting the bias voltage in accordance with a temperature of the image sensor detected by a temperature sensor, which is provided with an A-D converter for converting each sensor signal read from the image sensor into a digital signal, a memory holding a table of compensation values predetermined versus temperature values, wherefrom an offset compensation value is selected in accordance with a digitized temperature detection signal, and a digital temperature compensating circuit for executing the temperature compensation of the digitized sensor signal by using the compensation value read from the memory.

2. An output compensating device for an image sensor as defined in claim 1, wherein the compensation value readable from the memory is an offset compensation value corresponding to a detected temperature and the offset compensation of each sensor signal from the image sensor is executed using the offset compensation value.

3. An output compensating device for an image sensor as defined in claim 1, wherein the compensation value readable from the memory is a gain compensation multiplier corresponding to a detected temperature and the gain compensation of each sensor signal from the image sensor is executed by using the gain compensation multiplier.

4. An image sensor output compensating device as defined in claim 1, wherein an offset compensation value and a gain compensation multiplier are readable from the memory in accordance with a detected temperature, and each sensor signal output from the image sensor is processed first by the offset compensation using the offset compensation value and then by a gain compensation using the gain compensation value.

5. An output compensating device for an image sensor composed of a number of light sensor circuits each of which represents a unit pixel and is capable of producing in a photoelectric converting element a sensor current proportional to a quantity of light falling thereon and converting the current into a voltage signal by a MOS type transistor with a logarithmic output characteristic in a weak inverse state and provided with a means for removing a charge accumulated in a parasitic capacity of the photoelectric converting element by changing a drain voltage of the transistor to a value lower than a normal value for a specified period to initialize each pixel before detecting a light signal and outputting a pixel signal having a logarithmic characteristic at a large quantity of the sensor current and pixel signal having a non-logarithmic characteristic at a small quantity of the sensor current, wherein the output compensating device has a compensating means for executing offset compensation of each pixel signal from the image sensor and outputting a result signal if said signal has an output characteristic within a logarithmic response region and, if not, further executing gain compensation of said signal and outputting a result signal and executes the offset compensation for temperature characteristic variation of each pixel signal, the offset compensation and the gain compensation for output characteristic variation of each pixel signal and then the gain compensation for temperature characteristic variation of each pixel signal.

6. An output compensating device for an image sensor composed of a number of light sensor circuits each of which represents a unit pixel and is capable of producing in a photoelectric converting element a sensor current proportional to a quantity of light falling thereon and converting the current into a voltage signal by a MOS type transistor with a logarithmic output characteristic in a weak inverse state and provided with a means for removing a charge accumulated in a parasitic capacity of the photoelectric converting element by changing a drain voltage of the transistor to a value lower than a normal value for a specified period to initialize each pixel before detecting a light signal and outputting a pixel signal having a logarithmic characteristic at a large quantity of the sensor current and pixel signal having a non-logarithmic characteristic at a small quantity of the sensor current, wherein the output compensating device has a compensating means for executing offset compensation of each pixel signal from the image sensor and outputting a result signal if said signal has an output characteristic within a logarithmic response region and, if not, further executing gain compensation of said signal and outputting a result signal and executes the offset compensation for output characteristic variation of each pixel signal, the offset compensation and the gain compensation for temperature characteristic variation of each pixel signal and then the gain compensation for output characteristic variation of each pixel signal.

7. An output compensating device for an image sensor composed of a number of light sensor circuits each of which represents a unit pixel and is capable of producing in a photoelectric converting element a sensor current proportional to a quantity of light falling thereon and converting the current into a voltage signal by a MOS type transistor with a logarithmic output characteristic in a weak inverse state and provided with a means for removing a charge accumulated in a parasitic capacity of the photoelectric converting element by changing a drain voltage of the transistor to a value lower than a normal value for a specified period to initialize each pixel before detecting a light signal and outputting a pixel signal having a logarithmic characteristic at a large quantity of the sensor current and pixel signal having a non-logarithmic characteristic at a small quantity of the sensor current, wherein the output compensating device has a compensating means for executing offset compensation of each pixel signal from the image sensor and outputting a result signal if said signal has an output characteristic within a non-logarithmic response region and, if not, further executing gain compensation of said signal and outputting a result signal and executes the offset compensation for temperature characteristic variation of each pixel signal, the offset compensation and the gain compensation for output characteristic variation of each pixel signal and then the gain compensation for temperature characteristic variation of each pixel signal.

8. An output compensating device for an image sensor composed of a number of light sensor circuits each of which represents a unit pixel and is capable of producing in a photoelectric converting element a sensor current proportional to a quantity of light falling thereon and converting the current into a voltage signal by a MOS type transistor with a logarithmic output characteristic in a weak inverse state and provided with a means for removing a charge accumulated in a parasitic capacity of the photoelectric converting element by changing a drain voltage of the transistor to a value lower than a normal value for a specified period to initialize each pixel before detecting a light signal and outputting a pixel signal having a logarithmic characteristic at a large quantity of the sensor current and pixel signal having a non-logarithmic characteristic at a small quantity of the sensor current, wherein the output compensating device has a compensating means for executing offset compensation of each pixel signal from the image sensor and outputting a result signal if said signal has an output characteristic within a non-logarithmic response region and, if not, further executing gain compensation of said signal and outputting a result signal and executes the offset compensation for output characteristic variation of each pixel signal, the offset compensation and the gain compensation for temperature characteristic variation of each pixel signal and then the gain compensation for output characteristic variation of each pixel signal.

* * * * *